United States Patent
Liang et al.

(10) Patent No.: US 12,316,286 B2
(45) Date of Patent: May 27, 2025

(54) BIASING OF CASCODE POWER AMPLIFIERS FOR MULTIPLE POWER SUPPLY DOMAINS

(71) Applicant: Skyworks Solutions, Inc., Irvine, CA (US)

(72) Inventors: Bang Li Liang, Ottawa (CA); Guillaume Alexandre Blin, Carlisle, MA (US); Thomas Obkircher, Santa Ana, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 540 days.

(21) Appl. No.: 17/807,299

(22) Filed: Jun. 16, 2022

(65) Prior Publication Data

US 2023/0014555 A1    Jan. 19, 2023

Related U.S. Application Data

(60) Provisional application No. 63/203,125, filed on Jul. 9, 2021, provisional application No. 63/203,129, filed on Jul. 9, 2021.

(51) Int. Cl.
*H03F 3/24* (2006.01)
*H03F 1/02* (2006.01)
*H04B 1/40* (2015.01)

(52) U.S. Cl.
CPC .............. *H03F 3/245* (2013.01); *H03F 1/02* (2013.01); *H04B 1/40* (2013.01); *H03F 2200/451* (2013.01)

(58) Field of Classification Search
CPC .............. H03F 3/245; H03F 1/02; H04B 1/40
See application file for complete search history.

(56) References Cited

U.S. PATENT DOCUMENTS

| | | |
|---|---|---|
| 7,576,426 B2 | 8/2009 | Gan et al. |
| 7,629,201 B2 | 12/2009 | Gan et al. |
| 7,642,135 B2 | 1/2010 | Liang |
| 7,872,527 B2 | 1/2011 | Smith |
| 7,919,997 B2 | 4/2011 | Obkircher |
| 7,956,656 B2 | 6/2011 | Obkircher |
| 8,126,094 B2 | 2/2012 | Komaili et al. |
| 8,135,881 B1 | 3/2012 | Obkircher |
| 8,212,593 B2 | 7/2012 | Obkircher |
| 8,417,836 B2 | 4/2013 | Obkircher |

(Continued)

*Primary Examiner* — Patricia T Nguyen
(74) *Attorney, Agent, or Firm* — Knobbe, Martens, Olson & Bear, LLP

(57) ABSTRACT

Bias schemes for cascode power amplifiers are disclosed. In certain embodiments, a power amplifier system includes a cascode power amplifier powered by a first supply voltage and that amplifies a radio frequency input signal, and a bias circuit including a voltage regulator that generates a regulated voltage and is powered by the first supply voltage. The bias circuit further includes a bias voltage generation circuit that receives the regulated voltage and generates at least one cascode bias voltage for the cascode power amplifier, a switch that gates a second supply voltage to generate a gated supply voltage, a bias current generation circuit that controls a bias current of the cascode power amplifier and is powered by the gated supply voltage, and a gating circuit that controls the switch based on the regulated voltage and the second supply voltage.

20 Claims, 14 Drawing Sheets

(56) References Cited

U.S. PATENT DOCUMENTS

| | | | |
|---|---|---|---|
| 8,456,206 B2 | 6/2013 | Namdar-mehdiabadi et al. |
| 8,456,244 B2 | 6/2013 | Obkircher et al. |
| 8,565,358 B2 | 10/2013 | Komaili et al. |
| 8,698,565 B2 | 4/2014 | Obkircher et al. |
| 8,823,459 B2 | 9/2014 | Obkircher et al. |
| 8,900,931 B2 | 12/2014 | Liang |
| 8,922,268 B2 | 12/2014 | Madan et al. |
| 8,948,322 B2 | 2/2015 | Komaili et al. |
| 8,975,950 B2 | 3/2015 | Madan et al. |
| 9,013,225 B2 | 4/2015 | Madan et al. |
| 9,054,716 B2 | 6/2015 | Obkircher et al. |
| 9,148,194 B2 | 9/2015 | Madan et al. |
| 9,153,551 B2 | 10/2015 | Liang |
| 9,160,328 B2 | 10/2015 | Altunkilic et al. |
| 9,225,349 B2 | 12/2015 | Bourdi et al. |
| 9,231,606 B2 | 1/2016 | Bourdi et al. |
| 9,276,570 B2 | 3/2016 | Madan et al. |
| 9,313,079 B2 | 4/2016 | Komaili et al. |
| 9,450,570 B2 | 9/2016 | Obkircher et al. |
| 9,450,579 B2 | 9/2016 | Madan et al. |
| 9,450,591 B2 | 9/2016 | Obkircher et al. |
| 9,450,593 B2 | 9/2016 | Bourdi et al. |
| 9,509,363 B2 | 11/2016 | Madan et al. |
| 9,548,786 B2 | 1/2017 | Obkircher et al. |
| 9,620,424 B2 | 4/2017 | Blin et al. |
| 9,621,118 B2 | 4/2017 | Ripley et al. |
| 9,628,075 B2 | 4/2017 | Cebi et al. |
| 9,654,122 B2 | 5/2017 | Bourdi et al. |
| 9,667,210 B2 | 5/2017 | Couglar et al. |
| 9,673,853 B2 | 6/2017 | Blum |
| 9,685,943 B2 | 6/2017 | Madan et al. |
| 9,692,479 B2 | 6/2017 | Obkircher et al. |
| 9,698,734 B2 | 7/2017 | Lehtola et al. |
| 9,698,736 B2 | 7/2017 | Ripley et al. |
| 9,721,936 B2 | 8/2017 | Zhu et al. |
| 9,722,547 B2 | 8/2017 | Ripley et al. |
| 9,741,653 B2 | 8/2017 | Roy et al. |
| 9,780,741 B2 | 10/2017 | Ripley et al. |
| 9,787,467 B2 | 10/2017 | Obkircher et al. |
| 9,806,676 B2 | 10/2017 | Balteanu et al. |
| 9,837,324 B2 | 12/2017 | Blin et al. |
| 9,852,978 B2 | 12/2017 | Roy et al. |
| 9,859,945 B2 | 1/2018 | Obkircher et al. |
| 9,923,594 B2 | 3/2018 | Madan et al. |
| 9,966,988 B2 | 5/2018 | Burgener et al. |
| 9,973,088 B2 | 5/2018 | Balteanu et al. |
| 9,973,184 B2 | 5/2018 | Madan et al. |
| 9,985,588 B2 | 5/2018 | Rogers |
| 10,032,731 B2 | 7/2018 | Fuh et al. |
| 10,033,336 B2 * | 7/2018 | Banowetz | H03F 1/0266 |
| 10,050,592 B2 | 8/2018 | Shimamune |
| 10,056,901 B2 | 8/2018 | Roy et al. |
| 10,084,417 B2 | 9/2018 | Blum |
| 10,103,495 B2 | 10/2018 | Blin |
| 10,110,183 B2 | 10/2018 | Lyalin et al. |
| 10,147,724 B2 | 12/2018 | Madan et al. |
| 10,181,820 B2 | 1/2019 | Balteanu et al. |
| 10,187,023 B2 | 1/2019 | Andrys et al. |
| 10,229,902 B2 | 3/2019 | Zhu et al. |
| 10,230,351 B2 | 3/2019 | Obkircher et al. |
| 10,243,519 B2 | 3/2019 | Dykstra et al. |
| 10,250,199 B2 * | 4/2019 | Klaren | H03F 1/301 |
| 10,250,202 B2 | 4/2019 | Lehtola et al. |
| 10,255,982 B2 | 4/2019 | Zhou et al. |
| 10,256,921 B2 | 4/2019 | Bergsma et al. |
| 10,305,433 B2 | 5/2019 | Ranta et al. |
| 10,476,452 B2 | 11/2019 | Shapoury et al. |
| 10,892,720 B2 * | 1/2021 | Okabe | H03F 1/0216 |
| 11,128,261 B2 * | 9/2021 | Ranta | H03F 1/0227 |
| 11,316,550 B2 | 4/2022 | Liang et al. |
| 11,671,136 B2 | 6/2023 | Liang et al. |
| 2007/0070608 A1 | 3/2007 | Warren et al. |
| 2008/0217708 A1 | 9/2008 | Reisner et al. |
| 2010/0067622 A1 | 3/2010 | Komaili et al. |
| 2010/0156362 A1 | 6/2010 | Xie |
| 2010/0253298 A1 | 10/2010 | Nonis et al. |
| 2011/0298435 A1 | 12/2011 | Homol et al. |
| 2014/0009210 A1 | 1/2014 | Madan et al. |
| 2014/0009212 A1 | 1/2014 | Altunkilic et al. |
| 2015/0171108 A1 | 6/2015 | Blin et al. |
| 2015/0171860 A1 | 6/2015 | Blin |
| 2016/0126199 A1 | 5/2016 | Roy et al. |
| 2016/0126832 A1 | 5/2016 | Zhou et al. |
| 2017/0077916 A1 | 3/2017 | Zhou et al. |
| 2017/0149390 A1 | 5/2017 | Rogers et al. |
| 2017/0300076 A1 | 10/2017 | Liang et al. |
| 2017/0302231 A1 | 10/2017 | Ripley et al. |
| 2018/0034661 A1 | 2/2018 | Zhou et al. |
| 2018/0062580 A1 | 3/2018 | Rogers |
| 2018/0131339 A1 | 5/2018 | Ye et al. |
| 2018/0131369 A1 | 5/2018 | Popplewell et al. |
| 2018/0138862 A1 * | 5/2018 | Balteanu | H03F 1/223 |
| 2018/0138866 A1 | 5/2018 | Liang et al. |
| 2018/0138877 A1 | 5/2018 | Bergsma et al. |
| 2018/0138878 A1 | 5/2018 | Domino et al. |
| 2018/0144993 A1 | 5/2018 | Blin et al. |
| 2018/0158533 A1 | 6/2018 | Zhou et al. |
| 2018/0159478 A1 | 6/2018 | Balteanu et al. |
| 2018/0248523 A1 | 8/2018 | Rogers |
| 2018/0260358 A1 | 9/2018 | Obkircher et al. |
| 2018/0294781 A1 * | 10/2018 | Rogers | H03F 1/0277 |
| 2018/0316312 A1 | 11/2018 | Sharma et al. |
| 2018/0316316 A1 | 11/2018 | Banowetz et al. |
| 2018/0336955 A1 | 11/2018 | Zhou et al. |
| 2018/0342469 A1 | 11/2018 | Fuh et al. |
| 2018/0351554 A1 | 12/2018 | Roy et al. |
| 2019/0123690 A1 | 4/2019 | Balteanu et al. |
| 2019/0123698 A1 | 4/2019 | Lyalin et al. |
| 2019/0123699 A1 | 4/2019 | Andrys et al. |
| 2019/0131936 A1 | 5/2019 | Blum |
| 2019/0180833 A1 | 6/2019 | Zhou et al. |
| 2019/0190623 A1 | 6/2019 | Bergsma et al. |
| 2019/0206863 A1 | 7/2019 | Blin et al. |
| 2019/0214984 A1 | 7/2019 | Blin |
| 2019/0253054 A1 | 8/2019 | Roy et al. |
| 2019/0273076 A1 | 9/2019 | Zhu et al. |
| 2019/0273470 A1 * | 9/2019 | Rogers | H03F 3/72 |
| 2019/0295672 A1 | 9/2019 | Zhou et al. |
| 2019/0318793 A1 | 10/2019 | Zhou et al. |
| 2019/0334493 A1 | 10/2019 | Domino et al. |
| 2019/0372526 A1 | 12/2019 | Balteanu et al. |
| 2019/0386005 A1 | 12/2019 | Madan et al. |
| 2019/0386104 A1 | 12/2019 | Roy et al. |
| 2019/0386624 A1 | 12/2019 | Ye et al. |
| 2020/0021249 A1 | 1/2020 | Liang et al. |
| 2020/0057746 A1 | 2/2020 | Obkircher et al. |
| 2020/0091902 A1 | 3/2020 | Zhou et al. |
| 2020/0099340 A1 | 3/2020 | Sharma et al. |
| 2020/0099346 A1 | 3/2020 | Lehtola et al. |
| 2020/0106405 A1 | 4/2020 | Lehtola |
| 2020/0112289 A1 | 4/2020 | Rogers |
| 2020/0153428 A1 | 5/2020 | Popplewell et al. |
| 2020/0161965 A1 | 5/2020 | Zhou et al. |
| 2020/0162028 A1 | 5/2020 | Balteanu et al. |
| 2020/0162032 A1 | 5/2020 | Ripley et al. |
| 2020/0212849 A1 | 7/2020 | Kobayashi et al. |
| 2020/0259459 A1 | 8/2020 | Balteanu et al. |
| 2020/0272182 A1 | 8/2020 | Liang et al. |
| 2020/0272183 A1 | 8/2020 | Liang |
| 2020/0350247 A1 | 11/2020 | Zhou et al. |
| 2020/0395936 A1 | 12/2020 | Blin |
| 2022/0278707 A1 | 9/2022 | Liang et al. |
| 2022/0311136 A1 * | 9/2022 | Presti | H03F 3/45475 |
| 2023/0012894 A1 | 1/2023 | Liang et al. |
| 2023/0291431 A1 | 9/2023 | Liang et al. |

* cited by examiner

BIASING OF CASCODE POWER AMPLIFIERS FOR MULTIPLE POWER SUPPLY DOMAINS

CROSS-REFERENCE TO RELATED APPLICATIONS

This application claims the benefit of priority under 35 U.S.C. § 119 of U.S. Provisional Patent Application No. 63/203,125, filed Jul. 9, 2021 and titled "BIASING OF CASCODE POWER AMPLIFIERS FOR MULTIPLE POWER SUPPLY DOMAINS," and of Provisional Patent Application No. 63/203,129, filed Jul. 9, 2021 and titled "BIASING OF CASCODE POWER AMPLIFIERS FOR MULTIPLE OPERATING MODES," each of which is herein incorporated by reference in its entirety.

BACKGROUND

Technical Field

Embodiments of the invention relate to electronic systems, and in particular, to radio frequency (RF) electronics.

Description of Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to, mobile phones, tablets, base stations, network access points, laptops, and wearable electronics. Power amplifiers provide amplification to RF signals, which can have a frequency in the range from about 30 kHz to 300 GHz, for instance, in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a power amplifier system. The power amplifier system includes a cascode power amplifier powered by a first supply voltage and configured to amplify a radio frequency input signal, and a bias circuit including a voltage regulator configured to generate a regulated voltage and powered by the first supply voltage. The bias circuit further includes a bias voltage generation circuit configured to receive the regulated voltage and to generate at least one cascode bias voltage for the cascode power amplifier, a switch configured to gate a second supply voltage to generate a gated supply voltage, a bias current generation circuit configured to control a bias current of the cascode power amplifier and powered by the gated supply voltage, and a gating circuit configured to control the switch based on the regulated voltage and the second supply voltage.

In various embodiments, the cascode power amplifier includes a gain transistor and a first cascode transistor, the at least one cascode bias voltage including a first cascode bias voltage configured to bias the first cascode transistor. According to a number of embodiments, the first cascode transistor is a field-effect transistor having a gate biased by the first cascode bias voltage and a source biased by the bias current. In accordance with several embodiments, the cascode power amplifier further includes a second cascode transistor, the at least one cascode bias voltage including a second cascode bias voltage configured to bias the second cascode transistor.

In some embodiments, the bias circuit is configured to bias the cascode power amplifier across two or more voltage levels of the first supply voltage, the two or more voltage levels associated with two or more power supply domains.

In several embodiments, the bias circuit includes a cascode control circuit for setting a voltage level of the at least one cascode bias voltage generated by the bias voltage generation circuit, and an interface circuit powered by a third supply voltage and configured to generate a bias current control signal for the bias current generation circuit and a bias voltage control signal for the cascode control circuit. According to a number of embodiments, the gating circuit is further operable to control gating of the switch based on a voltage level of the third supply voltage. In accordance with some embodiments, the gating circuit is further configured to generate a power supply status signal for the cascode control circuit, the power supply status signal indicating when the gated supply voltage is active. According to various embodiments, the cascode control circuit includes a level shifter configured to level shift the bias voltage control signal to a power domain of the first supply voltage.

In certain embodiments, the present disclosure relates to a method of power amplifier biasing. The method includes amplifying a radio frequency input signal using a cascode power amplifier that receives power from a first supply voltage, generating a regulated voltage using a voltage regulator that receives power from the first supply voltage, and generating at least one cascode bias voltage for the cascode power amplifier based on the regulated voltage using a bias voltage generation circuit. The method further includes gating a second supply voltage to generate a gated supply voltage using a switch, including controlling the switch based on the regulated voltage and the second supply voltage. The method further includes controlling a bias current of the cascode power amplifier using a bias current generation circuit that receives power from the gated supply voltage.

In various embodiments, the method further includes setting a voltage level of the at least one cascode bias voltage using a cascode control circuit, and generating a bias current control signal for the bias current generation circuit and a bias voltage control signal for the cascode control circuit using an interface circuit that receives power from a third supply voltage. According to a number of embodiments, the method further includes controlling gating of the switch based on a voltage level of the third supply voltage. In accordance with several embodiments, the method further includes generating a power supply status signal for the cascode control circuit, the power supply status signal indicating when the gated supply voltage is active.

In certain embodiments, the present disclosure relates to a mobile device. The mobile device includes a transceiver configured to generate a radio frequency input signal, and a front end system including a cascode power amplifier powered by a first supply voltage and configured to amplify the radio frequency input signal. The front end system further includes a bias circuit including a voltage regulator configured to generate a regulated voltage and powered by the first supply voltage, a bias voltage generation circuit configured to receive the regulated voltage and to generate at least one cascode bias voltage for the cascode power amplifier, a switch configured to gate a second supply voltage to generate a gated supply voltage, a bias current generation circuit configured to control a bias current of the cascode power amplifier and powered by the gated supply voltage, and a gating circuit configured to control the switch based on the regulated voltage and the second supply voltage.

In various embodiments, the bias circuit is configured to bias the cascode power amplifier across two or more voltage levels of the first supply voltage, the two or more voltage levels associated with two or more power supply domains.

In several embodiments, the bias circuit includes a cascode control circuit for setting a voltage level of the at least one cascode bias voltage generated by the bias voltage generation circuit, and an interface circuit powered by a third supply voltage and configured to generate a bias current control signal for the bias current generation circuit and a bias voltage control signal for the cascode control circuit. According to a number of embodiments, the gating circuit is further operable to control gating of the switch based on a voltage level of the third supply voltage. In accordance with some embodiments, the gating circuit is further configured to generate a power supply status signal for the cascode control circuit, the power supply status signal indicating when the gated supply voltage is active. According to various embodiments, the cascode control circuit includes a level shifter configured to level shift the bias voltage control signal to a power domain of the first supply voltage.

In some embodiments, mobile device of claim 16 further comprising an antenna configured to wirelessly transmit an amplified radio frequency signal generated by the cascode power amplifier.

In certain embodiments, the present disclosure relates to a power amplifier system. The power amplifier system includes a cascode power amplifier biased by a first cascode bias voltage and configured to amplify a radio frequency input signal, the cascode power amplifier operable in a plurality of modes including a normal power transmit mode, a low power transmit mode, and a sleep mode. The power amplifier system further includes a bias voltage generation circuit including a first switch, a first cascode transmit mode bias circuit configured to provide the first cascode bias voltage to the cascode power amplifier through the first switch in the normal power transmit mode, a low power mode bias circuit configured to override the first cascode transmit mode bias circuit to set the first cascode bias voltage in the low power transmit mode, a second switch, and a sleep mode bias circuit configured to provide the first cascode bias voltage to the cascode power amplifier through the second switch in the sleep mode.

In various embodiments, the first cascode transmit mode bias circuit sets a voltage level of the first cascode bias voltage to a voltage level indicated by a first cascode bias control signal.

In some embodiments, the cascode power amplifier, the low power mode bias circuit, and the sleep mode bias circuit are powered by a first supply voltage. According to a number of embodiments, the bias voltage generation circuit detects the low power transmit mode based on a voltage level of a second supply voltage and of a regulated voltage.

In several embodiments, the plurality of modes further includes an idle mode in which a receiver is active and a transmitter including the cascode power amplifier is inactive, the sleep mode bias circuit configured to provide the first cascode bias voltage to the cascode power amplifier through the second switch in the idle mode.

In some embodiments, the cascode power amplifier includes a gain transistor and a first cascode transistor, the first cascode bias voltage configured to bias the first cascode transistor. According to a number of embodiments, the first cascode transistor is a field-effect transistor having a gate biased by the first cascode bias voltage. In accordance with several embodiments, the cascode power amplifier further includes a second cascode transistor biased by a second cascode bias voltage. According to various embodiments, the bias voltage generation circuit further includes a third switch, a second cascode transmit mode bias circuit configured to provide the second cascode bias voltage to the cascode power amplifier through the third switch in the normal power transmit mode, and a fourth switch, the low power mode bias circuit configured to override the second cascode transmit mode bias circuit to set the second cascode bias voltage in the low power transmit mode, and the sleep mode bias circuit configured to provide the second cascode bias voltage to the cascode power amplifier through the fourth switch in the sleep mode.

In certain embodiments, the present disclosure relates to a method of power amplifier biasing. The method includes amplifying a radio frequency input signal using a cascode power amplifier that is biased by a first cascode bias voltage and that is operable in a plurality of modes including a normal power transmit mode, a low power transmit mode, and a sleep mode. The method further includes providing the first cascode bias voltage from a first cascode transmit mode bias circuit through a first switch in the normal power transmit mode, overriding the first cascode transmit mode bias circuit to set the first cascode bias voltage in the low power transmit mode using a low power mode bias circuit, and providing the first cascode bias voltage from a sleep mode bias circuit through a second switch in the sleep mode.

In various embodiments, the method further includes powering the cascode power amplifier, the low power mode bias circuit, and the sleep mode bias circuit using a first supply voltage. According to a number of embodiments, the bias voltage generation circuit detects the low power transmit mode based on a voltage level of a second supply voltage and of a regulated voltage.

In several embodiments, the plurality of modes further includes an idle mode in which a receiver is active and a transmitter including the cascode power amplifier is inactive, the sleep mode bias circuit configured to provide the first cascode bias voltage to the cascode power amplifier through the second switch in the idle mode.

In certain embodiments, the present disclosure relates to a mobile device. The mobile device includes a transceiver configured to generate a radio frequency input signal, and a front end system including a cascode power amplifier biased by a first cascode bias voltage and configured to amplify a radio frequency input signal, the cascode power amplifier operable in a plurality of modes including a normal power transmit mode, a low power transmit mode, and a sleep mode. The front end system further includes a bias voltage generation circuit including a first switch, a first cascode transmit mode bias circuit configured to provide the first cascode bias voltage to the cascode power amplifier through the first switch in the normal power transmit mode, a low power mode bias circuit configured to override the first cascode transmit mode bias circuit to set the first cascode bias voltage in the low power transmit mode, a second switch, and a sleep mode bias circuit configured to provide the first cascode bias voltage to the cascode power amplifier through the second switch in the sleep mode.

In various embodiments, the first cascode transmit mode bias circuit sets a voltage level of the first cascode bias voltage to a voltage level indicated by a first cascode bias control signal.

In some embodiments, the cascode power amplifier, the low power mode bias circuit, and the sleep mode bias circuit are powered by a first supply voltage. According to a number of embodiments, the bias voltage generation circuit detects the low power transmit mode based on a voltage level of a second supply voltage and of a regulated voltage. In accordance with several embodiments, the plurality of modes further includes an idle mode in which a receiver of the transceiver is active and a transmitter of the transceiver is inactive, the sleep mode bias circuit configured to provide the first cascode bias voltage to the cascode power amplifier through the second switch in the idle mode.

In various embodiments, the cascode power amplifier includes a gain transistor and a first cascode transistor, the first cascode bias voltage configured to bias the first cascode transistor. According to a number of embodiments, the first cascode transistor is a field-effect transistor having a gate biased by the first cascode bias voltage. In accordance with some embodiments, the cascode power amplifier further includes a second cascode transistor biased by a second cascode bias voltage. According to several embodiments, the bias voltage generation circuit further includes a third switch, a second cascode transmit mode bias circuit configured to provide the second cascode bias voltage to the cascode power amplifier through the third switch in the normal power transmit mode, and a fourth switch, the low power mode bias circuit configured to override the second cascode transmit mode bias circuit to set the second cascode bias voltage in the low power transmit mode, and the sleep mode bias circuit configured to provide the second cascode bias voltage to the cascode power amplifier through the fourth switch in the sleep mode.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
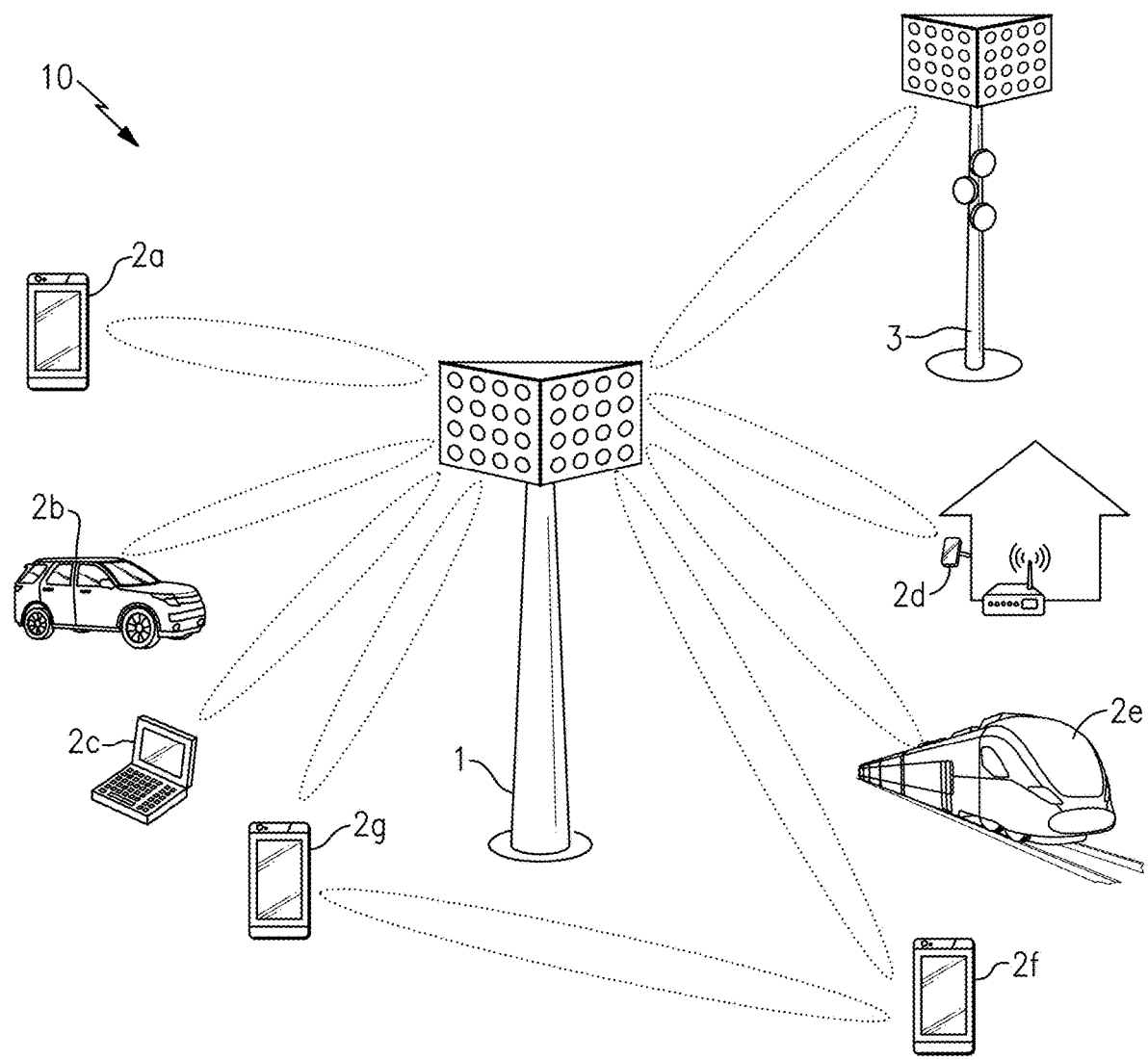
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
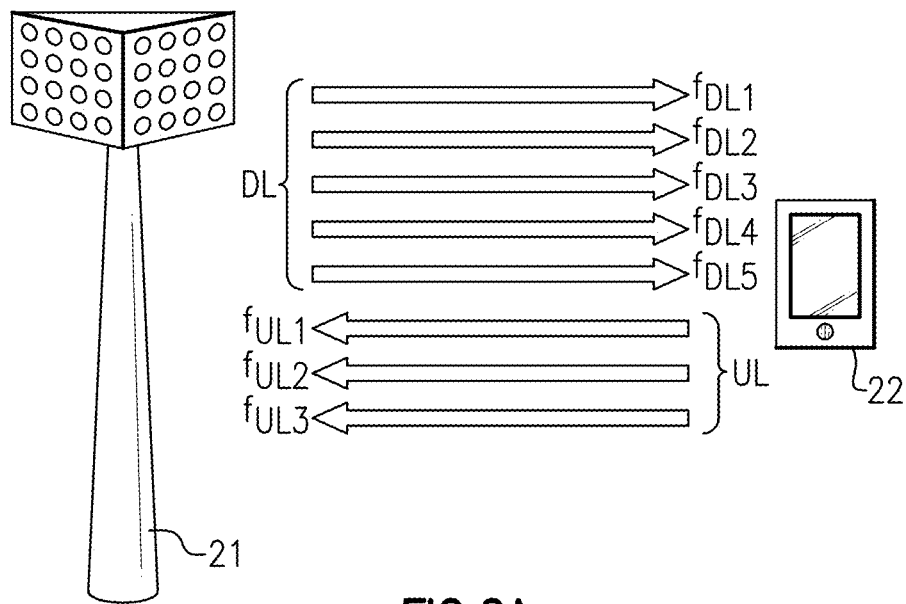
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
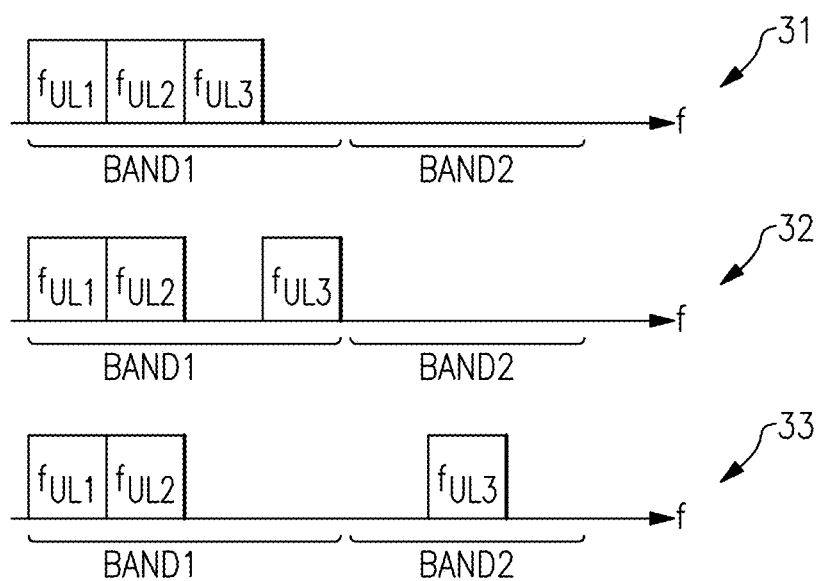
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
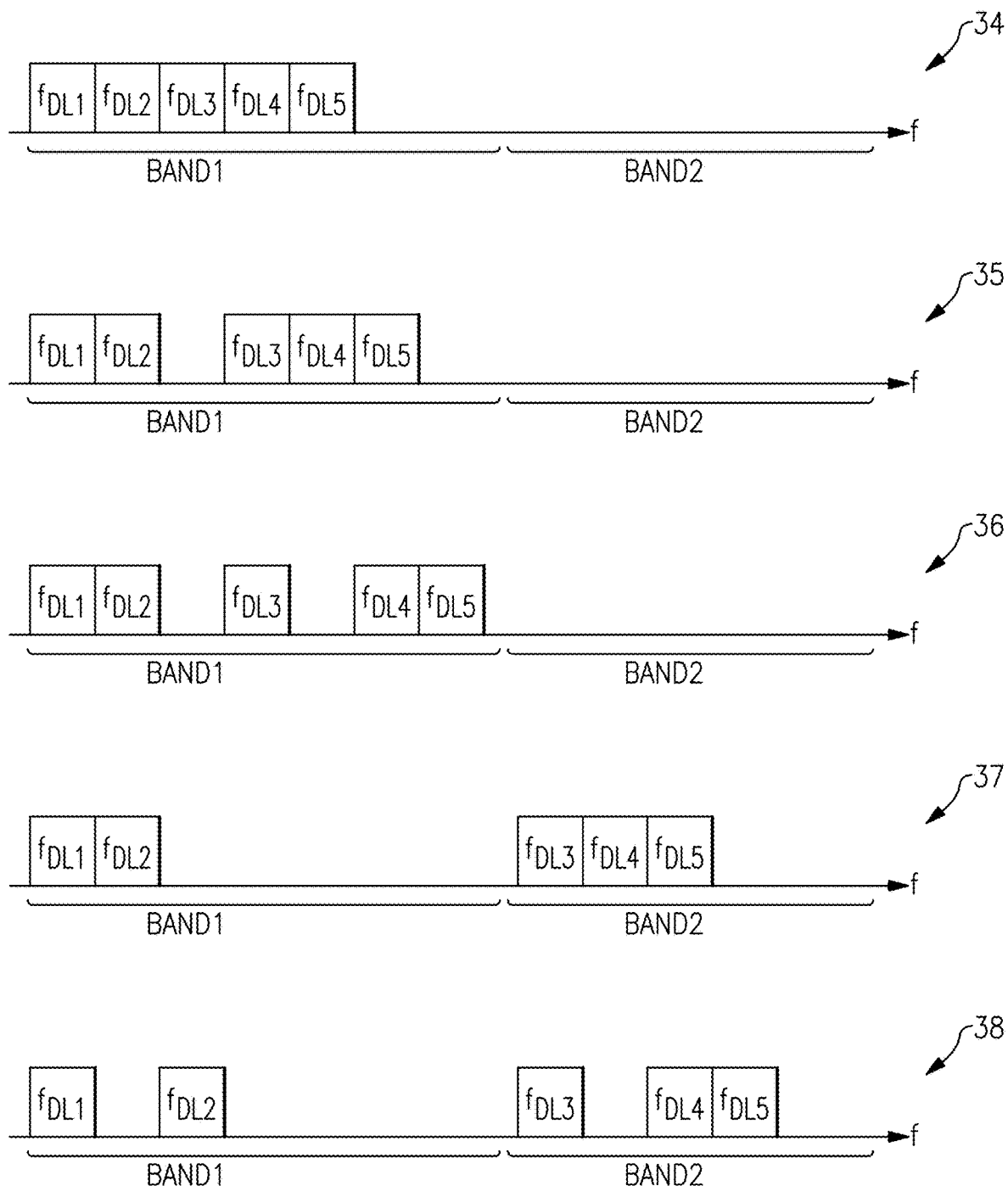
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
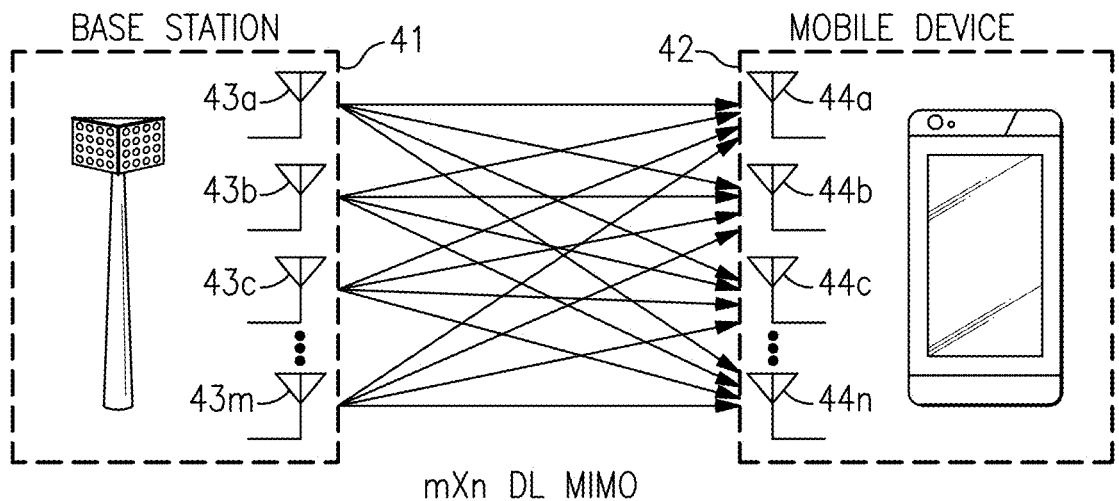
FIG. 3A is a schematic diagram of one example of a downlink channel using multi-input and multi-output (MIMO) communications.
Figure 3B:
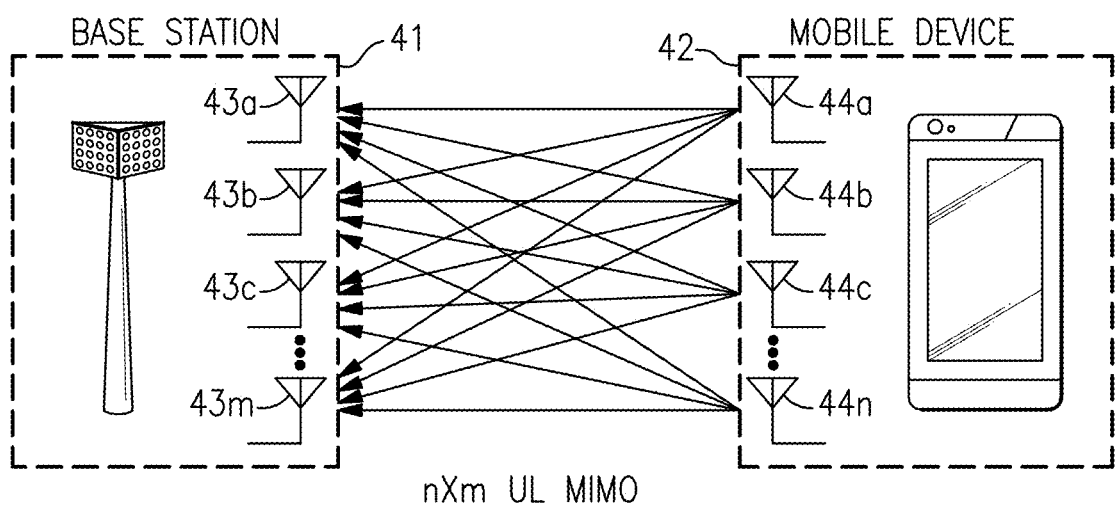
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
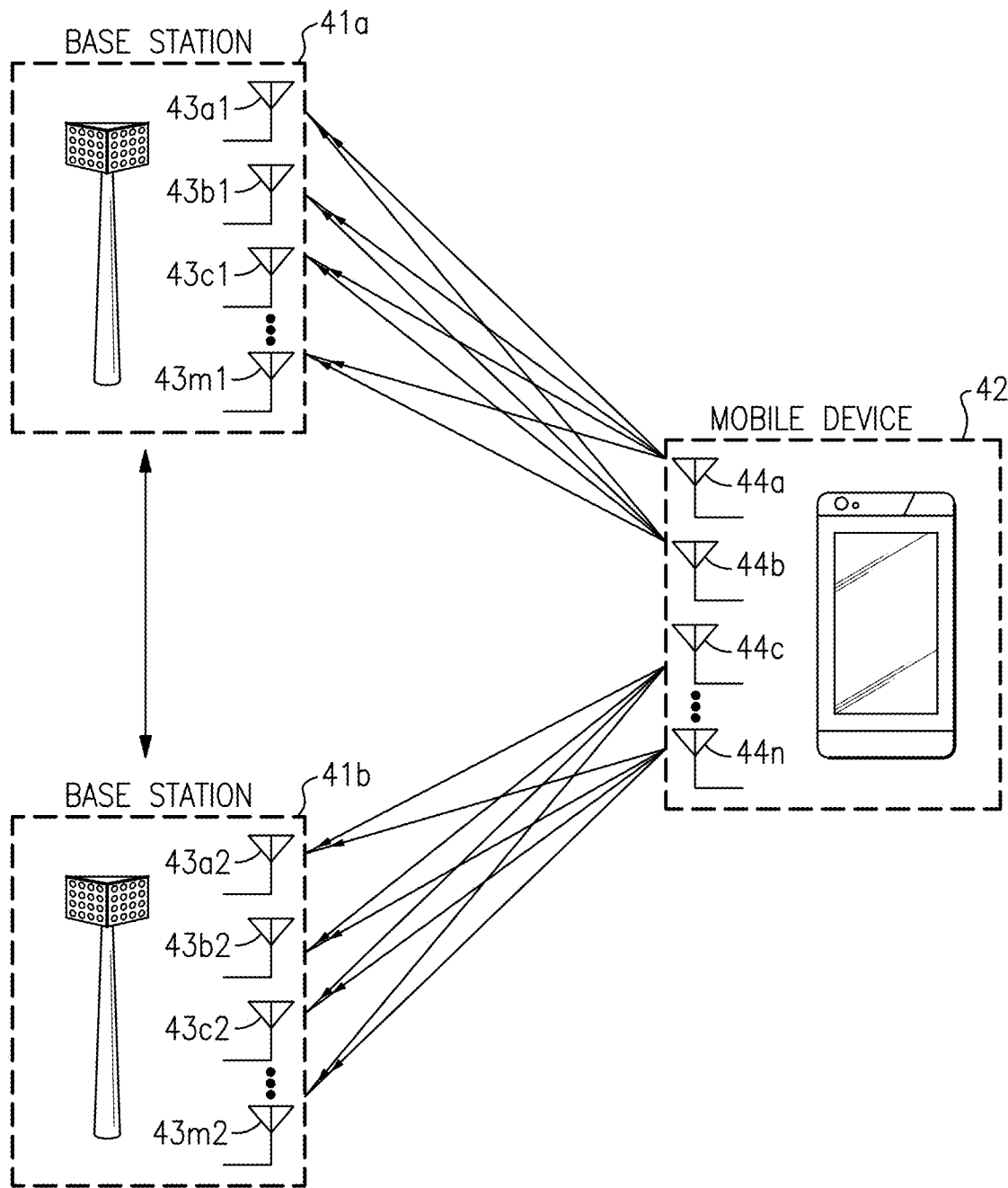
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

Figure 4A:
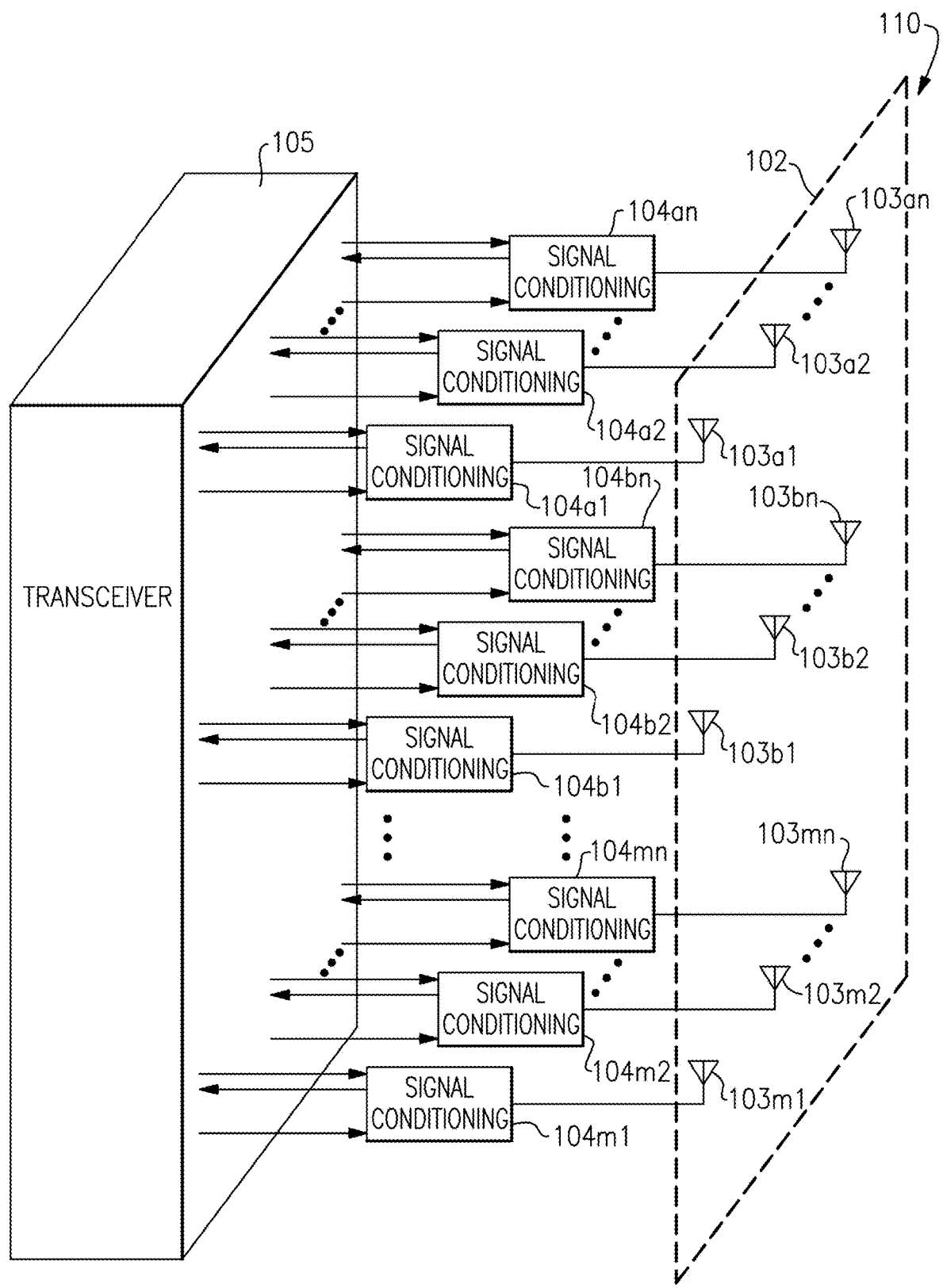
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
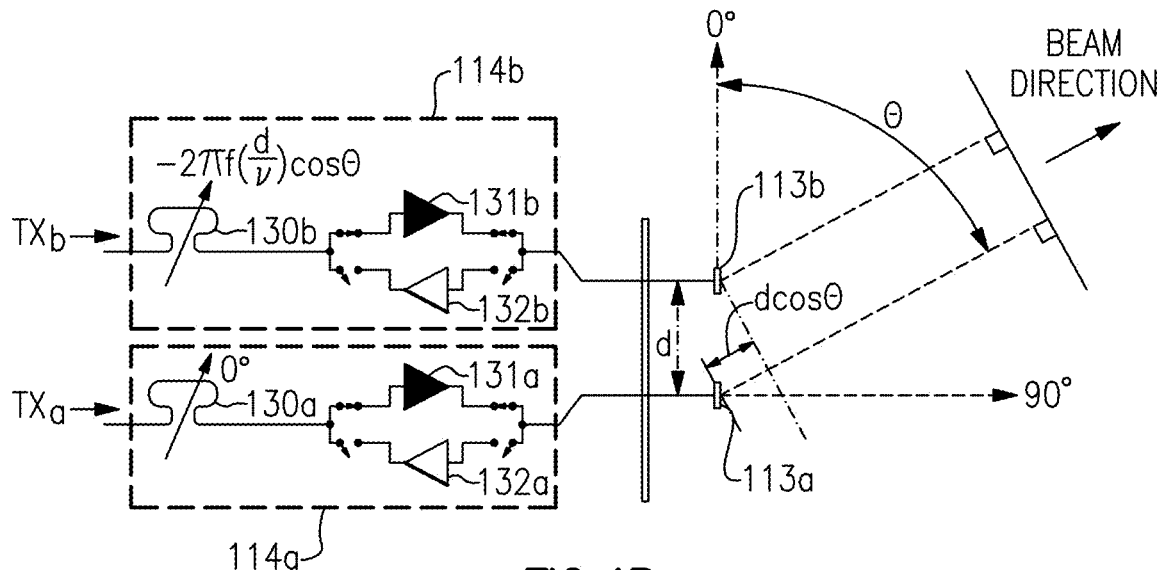
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 4B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
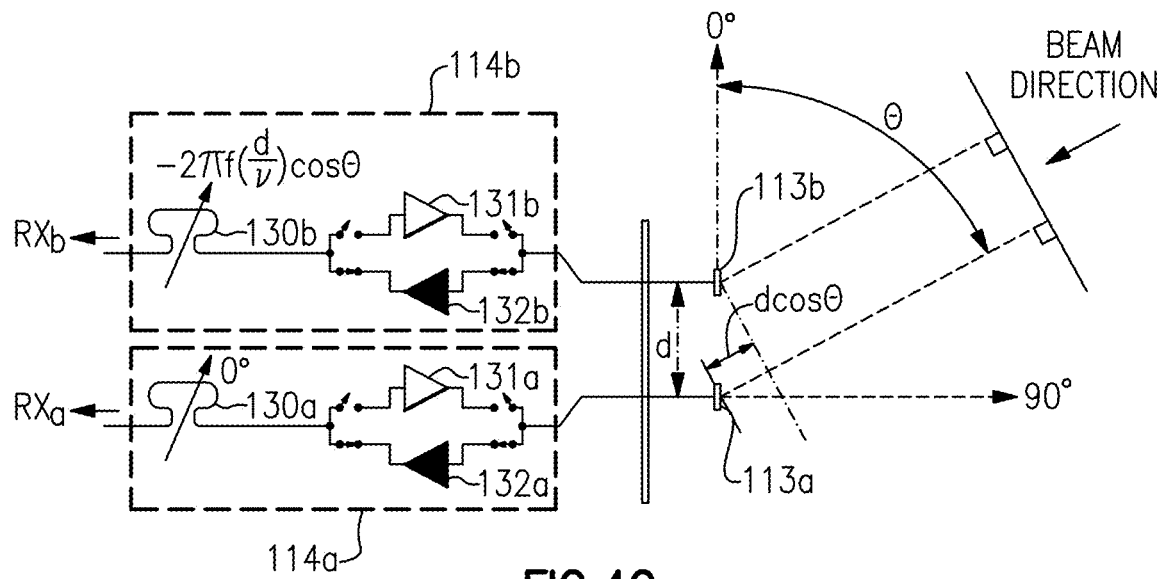
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about ½λ, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Biasing of Cascode Power Amplifiers for Multiple Power Supply Domains

Provided herein are cascode power amplifier bias circuits suitable for operating across multiple power supply domains. In certain embodiments, a power amplifier system includes a cascode power amplifier powered by a first supply voltage and a bias circuit that biases the cascode power amplifier. The bias circuit includes a voltage regulator that generates a regulated voltage and that is powered by the first supply voltage, a bias voltage generation circuit that receives the regulated voltage and generates at least one cascode bias voltage for the cascode power amplifier, a switch for gating a second supply voltage to generate a gated supply voltage, a bias current generation circuit that is powered by the gated supply voltage and that controls a bias current of the cascode power amplifier, and a gating circuit that controls the switch based on at least the regulated voltage and the second supply voltage.

By implementing the power amplifier system in this manner, the cascode power amplifier is reliably biased across a range of power sequencing scenarios associated with different activation sequences and/or voltage levels of the supply voltages. A supply voltage is also referred to herein as a power supply voltage.

In certain implementations, the power amplifier system further includes an interface circuit that is powered by a third supply voltage and that generates a bias current control signal for the bias current generation circuit and a bias voltage control signal for a control circuit of the bias voltage generation circuit. The gating circuit is further operable to control gating of the switch based on the voltage level of the third supply voltage. The gating circuit can also generate a power supply status signal for the control circuit of the bias voltage generation circuit to indicate when the gated supply voltage is active.

Thus, biasing of the cascode power amplifier is properly maintained even as the voltage levels of the supply voltages change (for instance, due to operating mode or a particular application) and/or are turn-on over different sequences. Accordingly, the bias circuit avoids a need for custom designs targeted for a particular power supply domain and/or reduces or eliminates constraints on power supply voltage levels and/or sequences.

The teachings herein can serve a wide variety of applications, including complex FEM applications utilizing millimeter wave (mmW) frequencies. For example, certain FEM applications desire a first power supply voltage (for instance, 2.5V+/−10% in a first domain or 3.3 V+/−10% in a second domain) for a high output power/high linearity power amplifier (for instance, a cascode power amplifier fabricated in SOI CMOS), a second power supply voltage (for instance, 1.2V+/−10%) for various control and biasing circuitry, and a third power supply voltage (for instance, 1.0V+/−5% or 1.2V+/−10%) for an input/output (I/O) interface. The teachings herein can be used for such FEM applications with varying power supply domains as well as to other applications and operating scenarios.

The cascode power amplifier can be implemented in a wide variety of ways, including, but not limited to, using field-effect transistor (FET) and/or bipolar transistor implementations including one cascode transistor, two cascode transistors, or three or more cascode transistors. In certain implementations, the cascode bias voltage(s) generated by the multi-domain bias circuit serve to bias gate(s) and/or base(s) of cascode transistors of the cascode power amplifier.

In certain implementations, the bias circuit is included on a semiconductor die of a front end system. Additionally, the bias circuit provides cascode bias voltages in applications with multiple power supply voltage domains, for instance, high performance front end modules for mmW communications.

In certain implementations, the cascode power amplifier amplifies millimeter wave signals, such as cellular FR2 signals. For example, Table 1 below depicts various examples of 5G FR2 frequency bands, and correspond to example frequency bands for signals amplified by the cascode power amplifier.

TABLE 1

| 5G Frequency Band | Band Duplex Type | UL/DL Low [MHz] | UL/DL High [MHz] |
|---|---|---|---|
| n257 | TDD | 26500 | 29500 |
| n258 | TDD | 24250 | 27500 |
| n259 | TDD | 39500 | 43500 |
| n260 | TDD | 37000 | 40000 |
| n261 | TDD | 27500 | 28350 |
| n262 | TDD | 47200 | 48200 |
| n263 | TDD | 57000 | 71000 |

Figure 5:
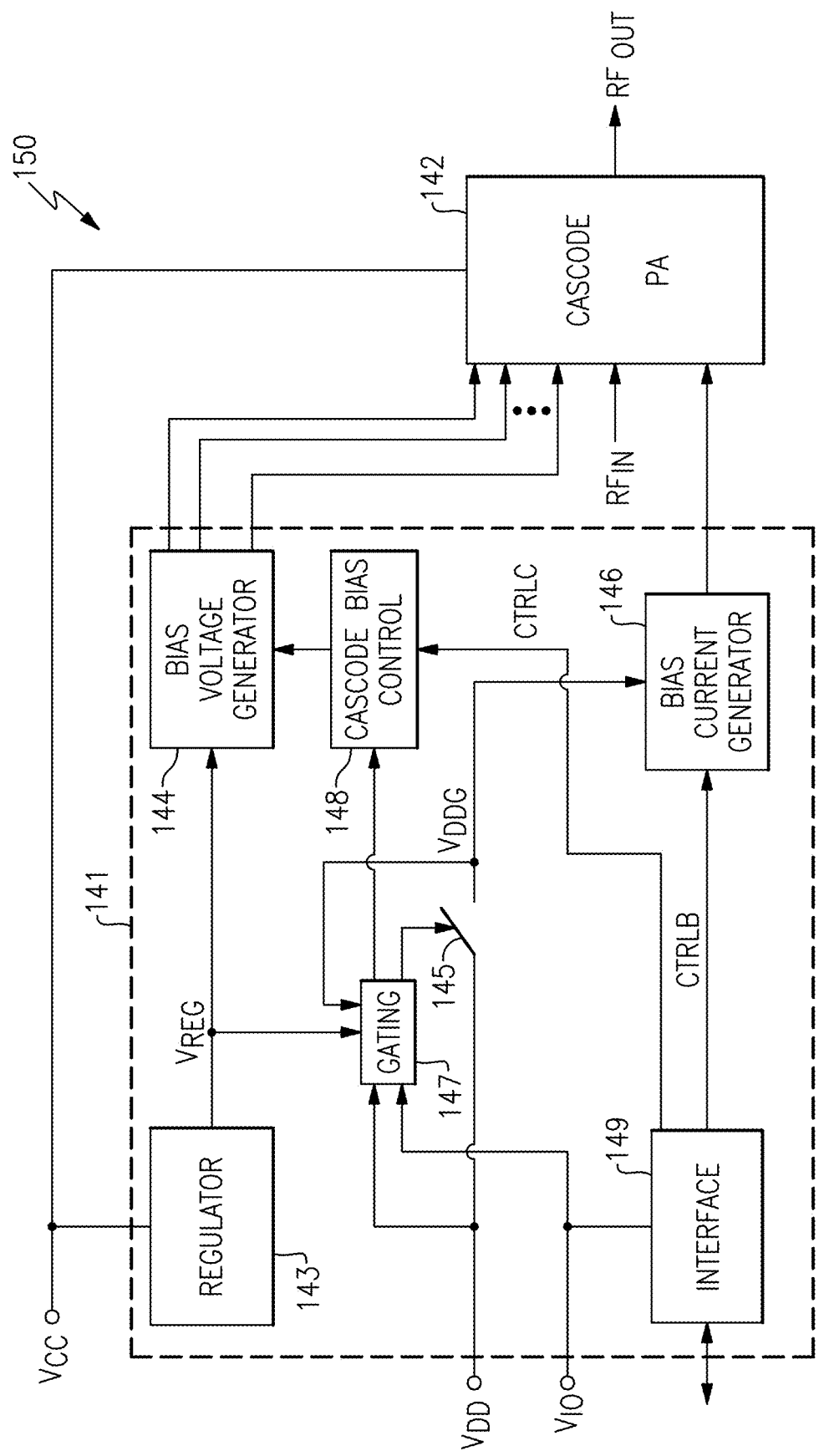
FIG. 5 is a schematic diagram of a power amplifier system according to one embodiment.

FIG. 5 is a schematic diagram of a power amplifier system 150 according to one embodiment. The power amplifier system 150 includes a bias circuit 141 and a cascode power amplifier 142. The power amplifier system 150 receives various power supply voltages, including a first power supply voltage $V_{CC}$, a second power supply voltage $V_{DD}$, and a third power supply voltage $V_{IO}$.

As shown in FIG. 5, the cascode power amplifier 142 amplifies an RF input signal $RF_{IN}$ to generate an RF output signal $RF_{OUT}$. Additionally, the cascode power amplifier 142 is powered by the first power supply voltage $V_{CC}$, and receives multiple cascode bias voltages from the bias circuit 141. Although FIG. 5 depicts the cascode power amplifier 142 as receiving three cascode bias voltages, the cascode power amplifier 142 can receive more or fewer cascode bias voltages as indicated by the ellipses. The bias circuit 141 also controls a bias current of the cascode power amplifier 142.

In the illustrated embodiment, the bias circuit 141 includes a voltage regulator 143, a bias voltage generator 144, a switch 145, a bias current generator 146, a gating circuit 147, a cascode bias control circuit 148, and an interface circuit 149.

As shown in FIG. 5, the voltage regulator 143 receives the first power supply voltage $V_{CC}$ and outputs a regulated voltage $V_{REG}$ that is provided to the bias voltage generator 144 and to the gating circuit 147. Thus, the voltage regulator 143 and the cascode power amplifier 142 are powered by a common power supply, in this embodiment. In certain implementations, the first power supply voltage $V_{CC}$ is operable at different voltage levels associated with different power supply domains desired for a particular application and/or operating scenario.

With continuing reference to FIG. 5, the bias voltage generator 144 receives a control signal from the cascode bias control circuit 148, and outputs one or more cascode bias voltages to the cascode power amplifier 142. The control signal from the cascode bias control circuit 148 determines the voltage level(s) of the one or more cascode bias voltages.

As shown in FIG. 5, the interface circuit 149 is powered by the third power supply voltage $V_{IO}$, and outputs a cascode control signal CTRLC and a bias control signal CTRLB. The cascode control signal CTRLC and the bias control signal CTRLB can be generated based on data received over an interface or bus, such as a Mobile Industry Processor Interface (MIPI). Since the interface circuit 149 is powered by the third power supply voltage $V_{IO}$, the values of the cascode control signal CTRLC and/or the bias control signal CTRLB may be improper when the third power supply voltage $V_{IO}$ is being turned on (for instance, during a power supply sequence or start-up). Moreover, when the cascode bias control circuit 148 loses power (for instance, in a particular operating mode, such as a low power mode, idle mode, or sleep mode), control data for setting the cascode bias voltages can also be invalid.

The switch 145 is used to gate the second power supply voltage $V_{DD}$ to generate a gated supply voltage $V_{DDG}$ that powers the bias current generator 146. In another embodiment, the gated supply voltage $V_{DDG}$ is also used to power the cascode bias control circuit 148 and/or other circuit blocks. The switch 145 is controlled (for example, selectively opened or closed) based on a gating control signal from the gating circuit 147. In one example, the gating is controlled based on the voltage levels of the regulated voltage $V_{REG}$, the second power supply voltage $V_{DD}$, and the third power supply voltage $V_{IO}$. For instance, the switch 145 can be opened when the regulated voltage $V_{REG}$, the second supply voltage $V_{DD}$, and the third power supply voltage $V_{IO}$ are active and otherwise opened.

The bias current generator 146 is powered by the gated supply voltage $V_{DDG}$, and operates to control a bias current of the cascode power amplifier 142. During normal operation, the bias current generator 146 sets the bias current based on the bias control signal CTRLB received from the interface circuit 149. However, when the gated supply voltage $V_{DDG}$ is inactive, the cascode power amplifier 142 is biased in a safe bias mode, for instance, little to no bias current.

As shown in FIG. 5, the gating circuit 147 also generates a power supply status signal for the cascode bias control circuit 148. The power supply status signal can be used to indicate a status of one or more of the power supplies, for instance, to indicate when the gated supply voltage $V_{DDG}$ is active. The cascode bias control circuit 148 can use the power supply status signal to choose a voltage level of one or more of the cascode bias voltage levels. For example, the cascode bias control circuit 148 can operate in the safe bias mode (associated with a safe selection of cascode bias voltage levels for the cascode power amplifier 152) when the power supply status signal indicates that the power supply voltages are not stable, and otherwise operate in a normal bias mode indicated by the cascode control signal CTRLC provided by the interface circuit 149.

The bias circuit 141 of FIG. 5 ensures safe biasing conditions of the cascode power amplifier 142 even when only some of the power supplies are active and/or control signals for setting the biases of the cascode power amplifier 142 have unknown values (for instance, during start-up or during a particular operating mode). Accordingly, the bias circuit 141 reduces or eliminates constraints on power supply voltage levels and/or sequences.

Figure 6:
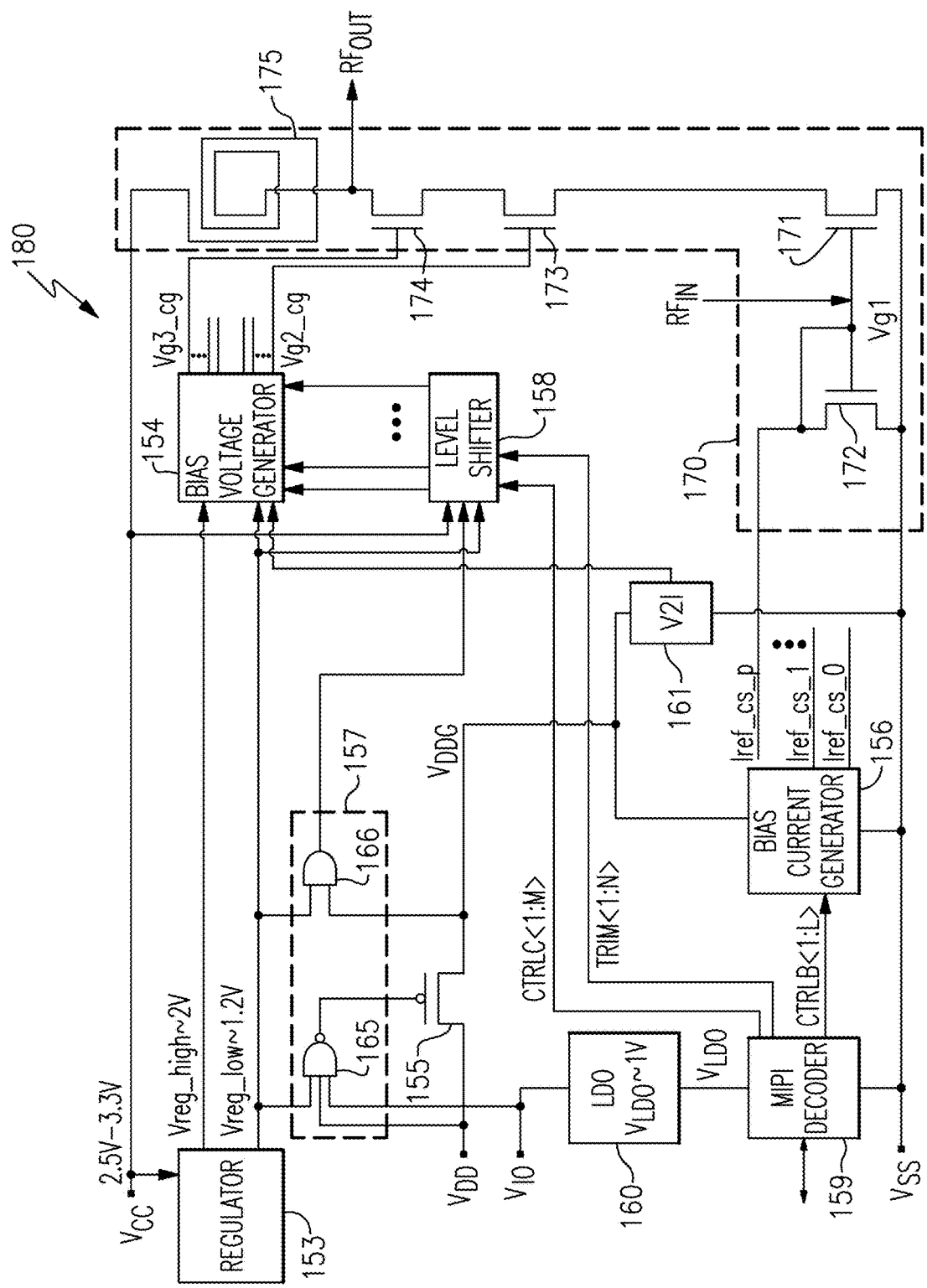
FIG. 6 is a schematic diagram of a power amplifier system according to another embodiment.

FIG. 6 is a schematic diagram of a power amplifier system 180 according to another embodiment. The power amplifier system 180 includes a cascode power amplifier 170 and a bias circuit including a voltage regulator 153, a bias voltage generator 154, a transistor switch 155, a bias current generator 156, a gating circuit 147, a cascode bias control circuit 158 (implemented as a level shifter, in this example), a MIPI decoder 159, a low dropout (LDO) regulator 160, and a voltage-to-current (V2I) circuit 161. The power amplifier system 180 receives various power supply voltages, including a first power supply voltage $V_{CC}$, a second power supply voltage $V_{DD}$, and a third power supply voltage $V_{IO}$. The power amplifier system 180 also receives a ground voltage $V_{SS}$.

In the illustrated embodiment, the voltage regulator 153 receives the first power supply voltage $V_{CC}$ that is operable across multiple power supply domains including at least a 2.5V domain and a 3.3V domain. The voltage regulator 153 generates a high regulated voltage Vreg_high of about 2V and a low regulated voltage Vreg_low of about 1.2V, in this example.

With continuing reference to FIG. 6, the bias voltage generator 154 receives the high regulated voltage Vreg_high and the low regulated voltage Vreg_low, and provides multiple selectable bias voltage levels for biasing the gates of the cascode power amplifier 170. The particular bias voltage levels chosen are set based on control signals from the level shifter 158.

The MIPI decoder 159 processes data received over a serial interface (depicted as a bidirectional arrow representing, for instance, a MIPI radio frequency front end (RFFE) bus) to generate a bias current control signal CTRLB<1:L> (L bits, in this example) for the bias current generator 156, and a cascode control signal CTRLC<1:M> (M bits, in this example) and a trim signal TRIM<1:N> (N bits, in this example) for the bias voltage generator 154. For example, the bias current control signal CTRLB<1:L> can be used for selecting amongst multiple reference current settings Iref_cs_0, Iref_cs_1, . . . Iref_cs_p for providing to an input current mirror of the cascode power amplifier 170. Additionally, the cascode control signal CTRLC<1:M> can be used for selecting the cascode bias voltage levels Vg3_cg and Vg2_cg, and the trim control signal <1:N> can be used to compensate the selection of the cascode bias voltages by providing trimming.

As shown in FIG. 6, the MIPI decoder 159 is powered by an LDO voltage $V_{LDO}$ generated by the LDO regulator 160 based on regulating the third power supply voltage $V_{IO}$, corresponding to an input/output (I/O) power supply. In this example, the LDO voltage $V_{LDO}$ is about 1V.

In the illustrated embodiment, the cascode power amplifier 170 includes a gain transistor 171, a first cascode transistor 173, and a second cascode transistor 174 that are connected in series and biased to operate as a double stack cascode amplifier. The cascode power amplifier 170 is implemented using FETs (for instance, silicon on insulator (SOI) metal oxide semiconductor (MOS) transistors), in this example. The cascode power amplifier 170 receives the first power supply voltage $V_{CC}$ and the ground voltage $V_{SS}$.

The cascode power amplifier 170 further includes a bias transistor 172 connected with the gain transistor 171 to form an input current mirror. The bias transistor 172 receives the selected bias current from the bias current generator 156 to thereby control a gate bias voltage Vg1 at the gate of the gain transistor 171, thereby setting a bias current flowing through the cascode power amplifier 170. The cascode power amplifier 170 further includes a choke inductor 175 that provides the first power supply voltage $V_{CC}$ to a drain of the second cascode transistor 174.

As shown in FIG. 6, the gate of the gain transistor 171 receives an RF input signal $RF_{IN}$, and the drain of the second cascode transistor 174 provides an RF output signal $RF_{OUT}$.

In the illustrated embodiment, the bias voltage generator 154 provides the first cascode gate bias voltage Vg2_cg to the gate of the first cascode transistor 173 and provides the second cascode gate bias voltage Vg3_cg to the gate of the second cascode transistor 174.

In the illustrated embodiment, the gating circuit 157 includes a NAND gate 165 (3-input, in this example) and an AND gate 166 (2-input, in this example).

As shown in FIG. 6, the transistor switch 155 (a p-type FET, in this example) is used to gate the second power supply voltage $V_{DD}$ to generate a gated supply voltage $V_{DDG}$ that powers the bias current generator 156 and the V2I circuit 161, which in turns provides a current (for instance, a reference current) to the bias voltage generator 154 when the gated supply voltage $V_{DDG}$ is active. The transistor switch 155 is controlled (for example, opened or closed) based on a gating control signal from the NAND gate 165, which receives the low regulated voltage Vreg_low, the second supply voltage $V_{DD}$, and the third power supply voltage $V_{IO}$. Thus, the transistor switch 155 is turned on when the low regulated voltage Vreg_low, the second power supply voltage $V_{DD}$, and the third power supply voltage $V_{IO}$ are active (at normal voltage levels), and otherwise is turned off.

The bias current generator 156 is powered by the gated power supply voltage $V_{DDG}$, and operates to control a bias current of the cascode power amplifier 152. During normal operation, the bias current generator 156 sets the bias current based on the bias control signal CTRLB<1:L> received from the MIPI decoder 159. However, when the gated supply voltage $V_{DDG}$ is inactive, the cascode power amplifier 152 is biased in a safe bias mode, for instance, little to no bias current.

As shown in FIG. 6, the AND gate 166 generates a power supply status signal for the level shifter 158. The power supply status signal can be used to indicate a status of the power supplies, for instance, to indicate when both the gated supply voltage $V_{DDG}$ and the low regulated voltage Vreg_low are active, in this example. The level shifter 158 uses the power supply status signal to choose a voltage level of the cascode bias voltage levels Vg3_cg and Vg2_cg.

For example, the level shifter 158 can operate in the safe bias mode (associated with a safe selection of cascode bias voltage levels for the cascode power amplifier 170) when the power supply status signal indicates that the power supply voltages are not stable, and otherwise operate in a normal bias mode indicated by the cascode control signal CTRLC<1:M> (as adjusted by any trimming indicated by the trimming signal TRIM<1:N>). The level shifter 158 also operates based on the first power supply voltage $V_{CC}$ and the low regulated voltage Vreg_low, in this example.

The bias circuit of FIG. 6 ensures safe biasing conditions of the cascode power amplifier 170 even when only some of the power supplies are active and/or control signals for setting the biases of the cascode power amplifier 170 have unknown values (for instance, during start-up or during a particular operating mode). Accordingly, the bias circuit reduces or eliminates constraints on power supply voltage levels and/or sequences.

Figure 7:
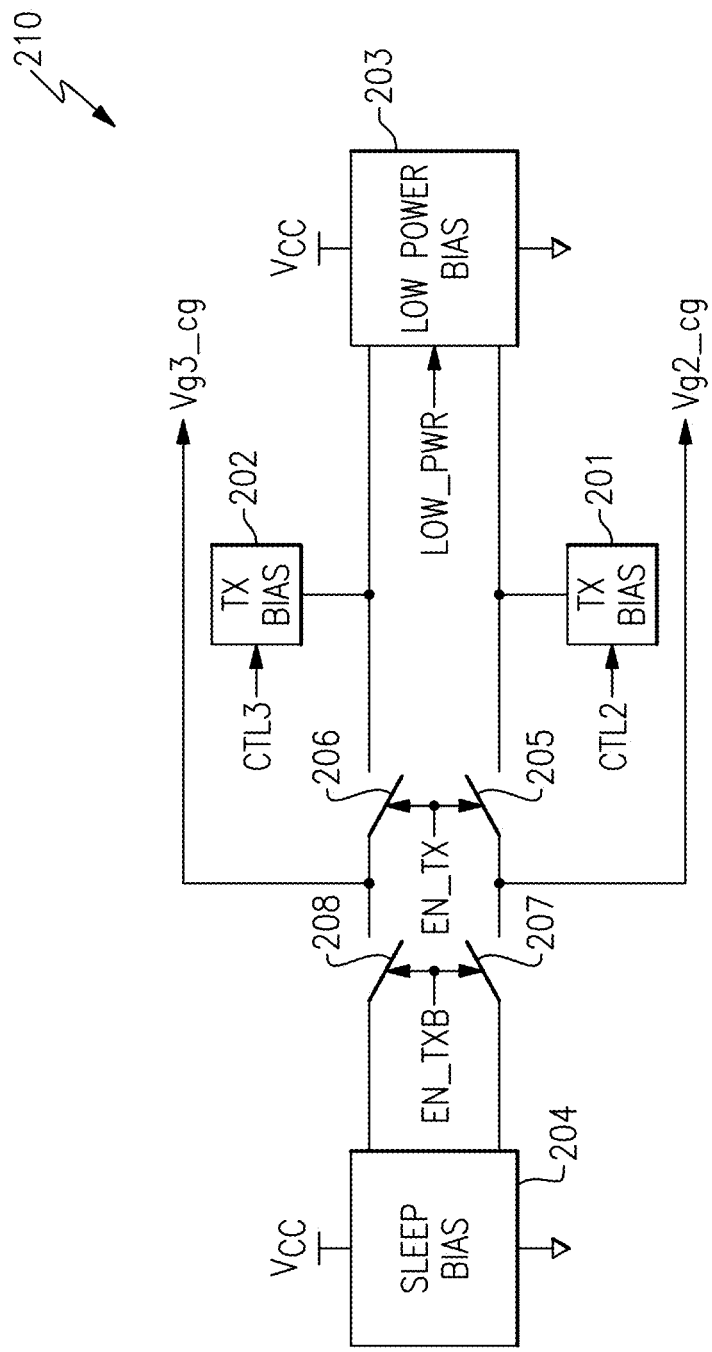
FIG. 7 is a schematic diagram of one embodiment of a bias voltage generator for a cascode power amplifier.

FIG. 7 is a schematic diagram of one embodiment of a bias voltage generator 210 for a cascode power amplifier. The bias voltage generator 210 includes a first cascode transmit mode bias circuit 201, a second cascode transmit mode bias circuit 202, a low power mode bias circuit 203, a sleep mode bias circuit 204, a first switch 205, a second switch 206, a third switch 207, and a fourth switch 208.

As shown in FIG. 7, the bias voltage generator 210 generates a first cascode gate bias voltage Vg2_cg (for a gate of a first cascode transistor of a cascode power amplifier) and a second cascode gate bias voltage Vg3_cg (for a gate of a second cascode transistor of the cascode power amplifier). Although an example is depicted in which the bias voltage generator 210 generates two cascode bias voltages, the bias voltage generator 210 can be adapted to generate more or fewer cascode bias voltages.

The bias voltage generator 210 receives a transmit enable signal EN_TX and an inverted transmit enable signal EN_TXB for indicating when a cascode power amplifier biased by the bias voltage generator 210 is transmitting. The bias voltage generator 210 also receives a low power signal LOW_PWR indicating when the cascode power amplifier is in a low power mode. In this example, the cascode power amplifier can transmit in a normal power transmit mode (associated with EN_TX being active and LOW_PWR being inactive) or a low power transmit mode (associated with EN_TX being active and LOW_PWR being active).

When the transmit enable signal EN_TX is active, the first switch 205 and the second switch 206 are closed, while the third switch 207 and the fourth switch are opened. When the low power signal LOW_PWR is also active, the low power mode bias circuit 203 overrides a bias of the first cascode gate bias voltage Vg2_cg set by the first cascode transmit mode bias circuit 201 and overrides a bias of the second cascode gate bias voltage Vg3_cg set by the second cascode transmit mode bias circuit 202. However, when the low power signal LOW_PWR is inactive, the first cascode transmit mode bias circuit 201 sets the first cascode gate bias voltage Vg2_cg to a particular voltage level indicated by a first cascode control signal CTL2, and the second cascode transmit mode bias circuit 202 sets the second cascode gate bias voltage Vg3_cg to a particular voltage level indicated by a second cascode control signal CTL3.

With continuing reference to FIG. 7, when the transmit enable signal EN_TX is inactive (and thus the inverted transmit enable signal EN_TXB is active), the first switch 205 and the second switch 206 are opened, while the third switch 207 and the fourth switch 208 are closed. Additionally, the sleep bias circuit 204 (associated with at least one of a sleep mode or an idle mode) sets the bias of the first cascode gate bias voltage Vg2_cg and the bias of the second cascode gate bias voltage Vg3_cg set to voltage levels associated with reliable transistor biasing (for instance, in compliance with maximum transistor junction voltages, such as source-to-drain voltages for the cascode transistors) and/or low static power consumption.

Figure 8:
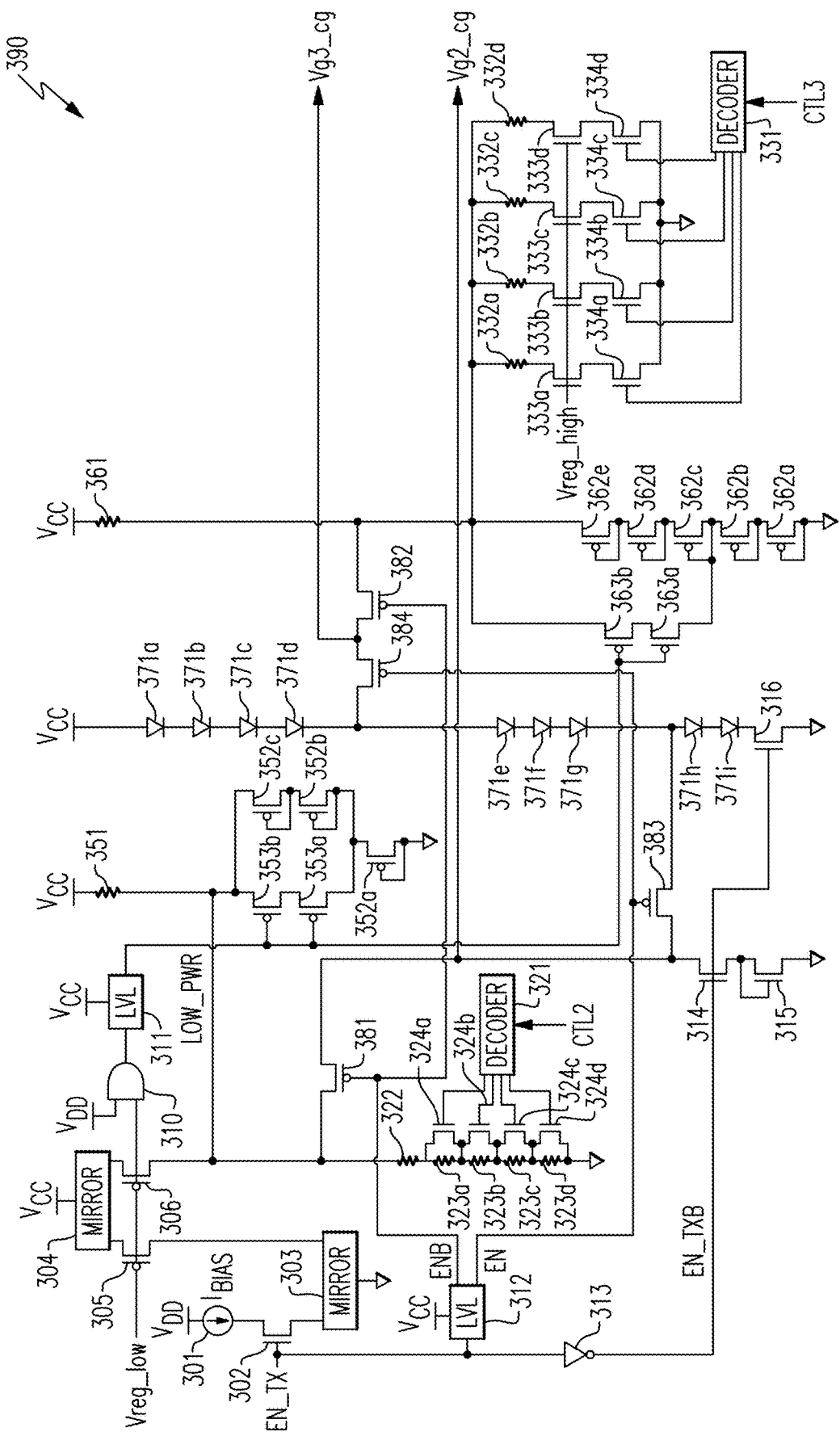
FIG. 8 is a schematic diagram of another embodiment of a bias voltage generator for a cascode power amplifier.

FIG. 8 is a schematic diagram of another embodiment of a bias voltage generator 390 for a cascode power amplifier. The bias voltage generator 390 receives a first power supply voltage $V_{CC}$ (which is shared with the cascode power amplifier, in certain implementations), a second power supply voltage $V_{DD}$ (which is gated, in certain implementations), a transmit enable signal EN_TX, a low regulated voltage Vreg_low, a high regulated voltage Vreg_high, a first cascode control signal CTL2, a second cascode control signal CTL3, and a ground voltage. Additionally, the bias voltage generator 390 generates a first cascode gate bias voltage Vg2_cg (for a gate of a first cascode transistor of a cascode power amplifier) and a second cascode gate bias voltage Vg3_cg (for a gate of a second cascode transistor of the cascode power amplifier). Although an example is depicted in which the bias voltage generator 390 generates two cascode bias voltages, the bias voltage generator 390 can be adapted to generate more or fewer cascode bias voltages.

In the illustrated embodiment, the bias voltage generator 390 includes a bias current source 301 (powered by $V_{DD}$), a bias current disable n-type field-effect transistor (NFET) 302, a first current mirror 303, a second current mirror 304, a first regulated p-type field-effect transistor (PFET) 305, a second regulated PFET 306, an AND gate 310 (for performing an AND operation on Vreg_low and $V_{DD}$ to determine operation in a low power transmit mode), a first level shifter 311 (for level shifting the output of the AND gate 310 to the $V_{CC}$ domain to generate signal LOW_PWR indicating operating in the low power transmit mode), a second level shifter 312 (to level shift EN_TX to the $V_{CC}$ domain to generate signals EN and ENB), an inverter 313 (for inverting EN_TX to generate signal EN_TXB), a first diode-enabling transistor 314, a diode-connected NFET 315, and a second diode enabling transistor 316.

The bias voltage generator 390 further includes a first cascode transmit mode bias circuit including a fixed resistor 322, selectable resistors 323a, 323b, 323c, and 323d (in series with the fixed resistor 322, in this example), selection transistors 324a, 324b, 324c, and 324d, and a first decoder 321 controlled by a first cascode control signal CTL2. When operating in a normal power transmit mode (EN_TX is active and LOW_PWR is inactive), the first cascode transmit mode bias circuit sets the bias of the first cascode gate bias voltage Vg2_cg. In this example, the selection transistors 324a-324d control the selectable resistors 323a-323d, respectively, to control an amount of resistance that the mirrored reference current (flowing from the second current mirror 304 through PFET 306) and any current from the resistor 351 flows through.

With continuing reference to FIG. 8, the bias voltage generator 390 further includes a second cascode transmit mode bias circuit including selectable resistors 332a, 332b, 332c, and 332d (in parallel, in this example), current source NFETs 333a, 333b, 333c, and 333d (biased by vreg_high, in this example), selection transistors 334a, 334b, 334c, and 334d, and a second decoder 331 controlled by a second cascode control signal CTL3. When operating in a normal power transmit mode (EN_TX is active and LOW_PWR is inactive), the second first cascode transmit mode bias circuit sets the bias of the second cascode gate bias voltage Vg3_cg. In this example, the selection transistors 334a-334d control the number of active current source transistors to control an amount of current flowing through the resistor 361 to set the second cascode gate bias voltage Vg3_cg.

The bias voltage generator 390 further includes a low power mode bias circuit including a first sub-circuit for setting the first cascode gate bias voltage Vg2_cg in a low power transmit mode (EN_TX is active and LOW_PWR is active) and a second sub-circuit for setting the second cascode gate bias voltage Vg3_cg in the low power transmit mode. The first sub-circuit includes diode-connected PFETs 352a, 352b, and 352c and bypass PFETs 353a and 353b for selectively bypassing the diode-connected PFETs 352b and 352c in the low power transmit mode. The second sub-circuit includes diode-connected PFETs 362a, 362b, 362c, 362d, and 362e and bypass PFETs 363a, 363b for selectively bypassing the diode-connected PFETs 362c, 362d, and 362e in the low power transmit mode.

When in the low power transmit mode, the low power mode bias circuit overrides the first cascode transmit mode bias circuit and the second cascode transmit mode bias circuit (thus, the CTL2 and CTL3 signals do not set the cascode bias voltage levels in the low power transmit mode).

With continuing reference to FIG. 8, the bias voltage generator 390 further includes a sleep mode bias circuit including diodes 371a, 371b, 371c, 371d, 371e, 371f, 371g, 371h, and 371i, which are in series with the second diode enabling transistor 316. When in sleep mode (EN_TX is inactive), the diodes 371a-371i serves as a voltage divider for generating the first cascode gate bias voltage Vg2_cg and the second cascode gate bias voltage Vg3_cg.

The bias voltage generator 390 further includes a first PFET switch 381, a second PFET switch 382, a third PFET switch 383, and a fourth PFET switch 384. When the transmit enable signal EN_TX is inactive, the first PFET switch 381 and the second PFET switch 382 are opened, while the third PFET switch 383 and the fourth PFET switch 384 are closed. Additionally, the sleep bias circuit (associated with at least one of a sleep mode or an idle mode) sets the bias of the first cascode gate bias voltage Vg2_cg and the bias of the second cascode gate bias voltage Vg3_cg set to voltage levels associated with reliable transistor biasing (for instance, in compliance with maximum transistor junction voltages, such as source-to-drain voltages for the cascode transistors) and/or low static power consumption.

However, when the transmit enable signal EN_TX is active, the first PFET switch 381 and the second PFET switch 382 are closed, while the third PFET switch 383 and the fourth PFET switch 384 are opened. When the low power signal LOW_PWR is also active, the low power mode bias circuit overrides a bias of the first cascode gate bias voltage Vg2_cg set by the first cascode transmit mode bias circuit and overrides a bias of the second cascode gate bias voltage Vg3_cg set by the second cascode transmit mode bias circuit. However, when the low power signal LOW_PWR is inactive, the first cascode transmit mode bias circuit sets the first cascode gate bias voltage Vg2_cg to a particular voltage level indicated by the first cascode control signal CTL2, and the second cascode transmit mode bias circuit sets the second cascode gate bias voltage Vg3_cg to a particular voltage level indicated by the second cascode control signal CTL3.

In one embodiment, the bias voltage generator 390 is included in the power amplifier system 180 of FIG. 4 to support operation in multiple modes associated with different combinations of supply voltages being active. For example, in a normal transmit mode, $V_{IO}$, $V_{DD}$, and $V_{CC}$ can be turned on and CTL2 and CTL3 can set the cascode bias levels. However, in a low power transmit mode (indicated by $V_{DD}$=0V, in this example), CTL2 and CTL3 do not set the cascode bias voltage levels but rather the low power mode bias circuit sets the cascode bias voltage levels.

Furthermore, in idle mode (associated with a transmitter being disable and a receiver being enabled, such as for TDD applications), the diodes 371a-371i set the cascode bias voltage levels. Furthermore, in a sleep mode, (indicated by $V_{DD}$=0V and $V_{IO}$=0V, in this example) all circuitry powered by $V_{IO}$ and $V_{DD}$ and the will be powered down and the diodes 371a-371i set the cascode bias voltage levels, for instance, to achieve a desired tradeoff between leakage current and low voltage NFET device reliability (for instance, gate oxide breakdown for n-type metal oxide semiconductor or NMOS implementations).

Figure 9:
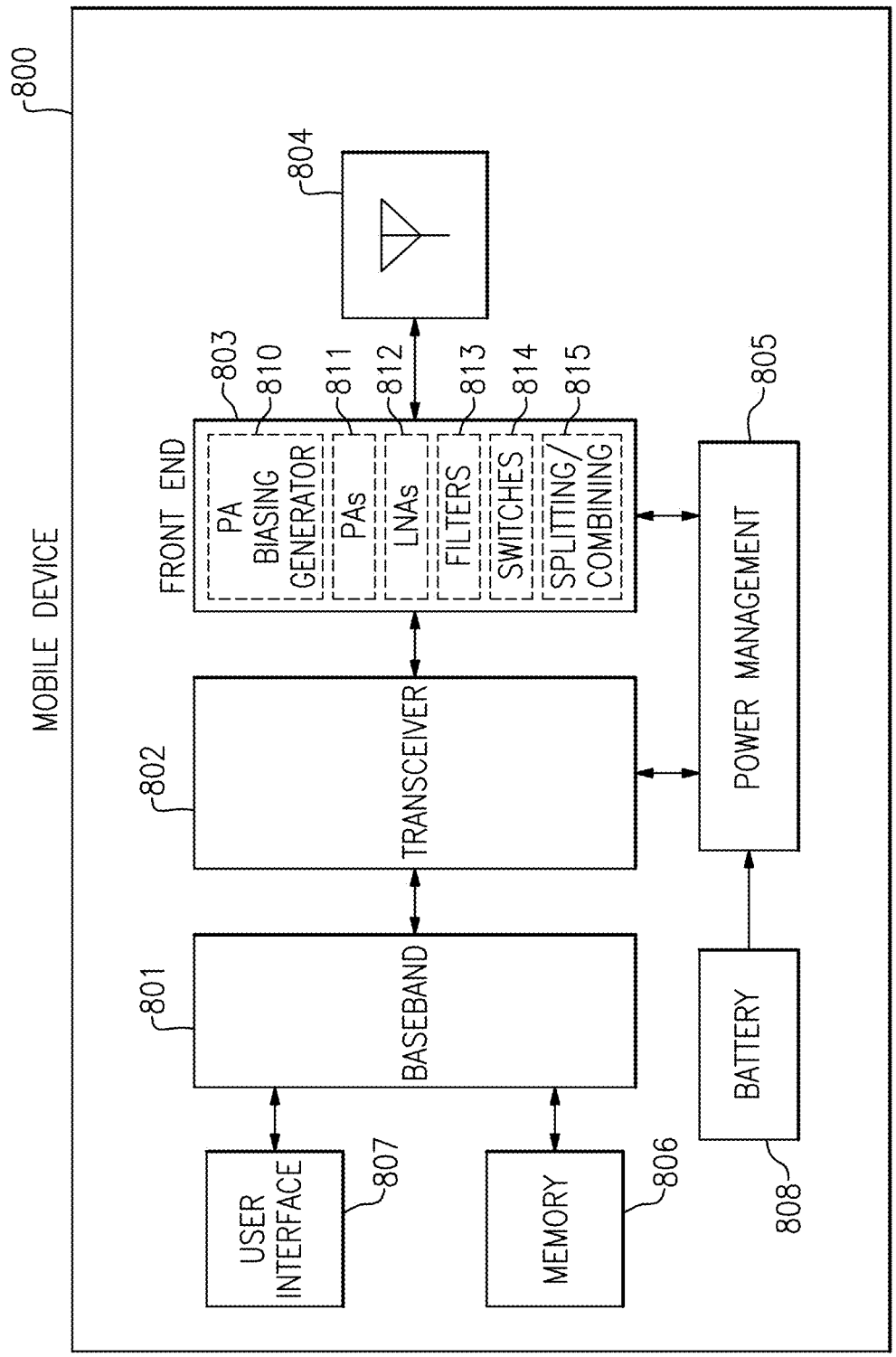
FIG. 9 is a schematic diagram of one embodiment of a mobile device.

FIG. 9 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes a PA biasing generator 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The mobile device system 800 illustrates one example application of a PA biasing generator implemented in accordance with the teachings herein. However, the PA biasing generators herein can be used in a wide variety of applications.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 9, the power management system 805 receives a battery voltage from the battery 808. The battery 808 can be any suitable battery for use in the mobile device 800, including, for example, a lithium-ion battery.

Figure 10:
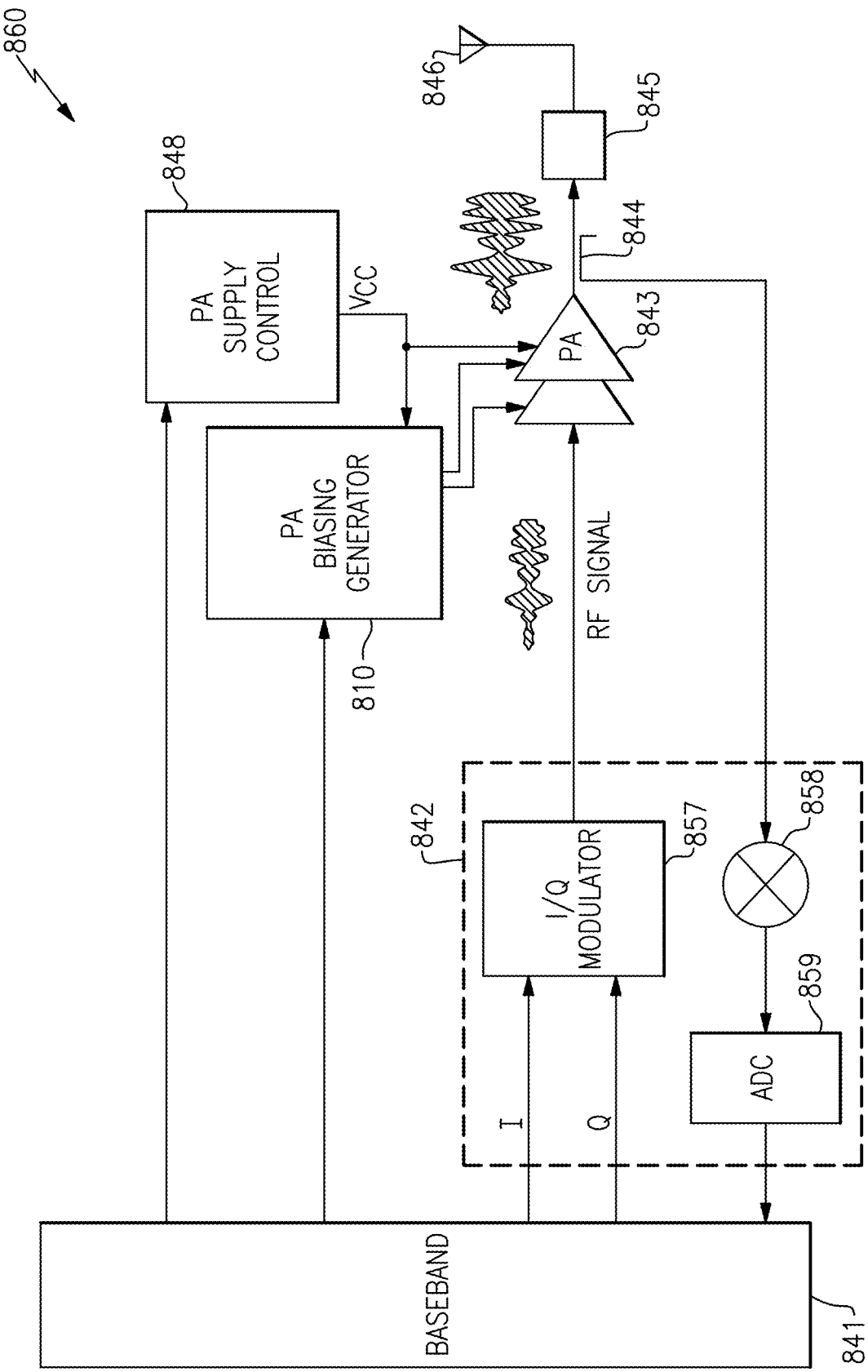
FIG. 10 is a schematic diagram of a power amplifier system according to another embodiment.

FIG. 10 is a schematic diagram of a power amplifier system 860 according to another embodiment. The illustrated power amplifier system 860 includes a PA biasing generator 810, a baseband processor 841, a transmitter/observation receiver 842, a power amplifier (PA) 843, a directional coupler 844, front-end circuitry 845, an antenna 846, a PA biasing generator 810, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 10, the PA biasing generator 810 receives a bias control signal from the baseband processor 841, and generates bias control signals for the power amplifier 843. In the illustrated configuration, the PA biasing generator 810 generates bias control signals for both an input stage of the power amplifier 843 and an output stage of the power amplifier 843. However, other implementations are possible.

In the illustrated embodiment, the PA biasing generator 810 serves to generate one or more bias voltages for the power amplifier 843, which can include one or more cascode amplifier stages.

The power amplifier system 860 illustrates another example application of a PA biasing generator implemented in accordance with the teachings herein. However, the PA biasing generators herein can be used in a wide variety of applications.

Figure 11A:
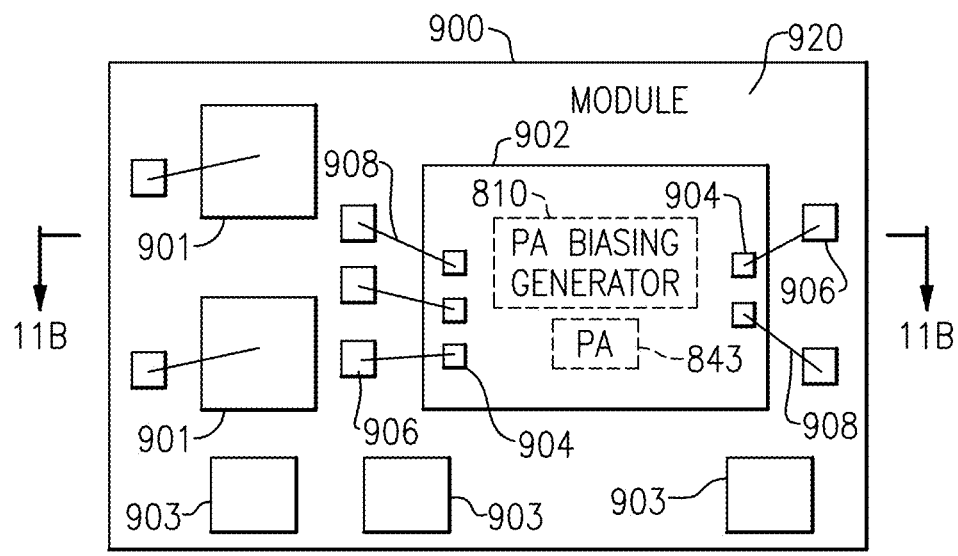
FIG. 11A is a schematic diagram of one embodiment of a packaged module.
Figure 11B:
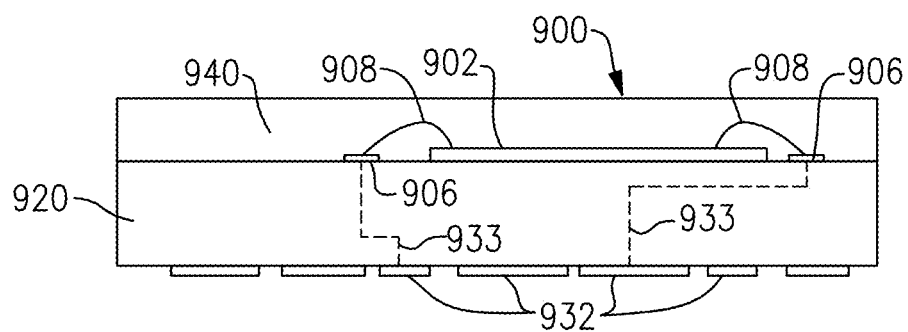
FIG. 11B is a schematic diagram of a cross-section of the packaged module of FIG. 11A taken along the lines 11B-11B.

FIG. 11A is a schematic diagram of one embodiment of a packaged module 900. FIG. 11B is a schematic diagram of a cross-section of the packaged module 900 of FIG. 11A taken along the lines 11B-11B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a power amplifier 843 and a PA biasing generator 810 implemented in accordance with one or more features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 11B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 14B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

Some of the embodiments described above have provided examples of power amplifier biasing in connection with mobile devices (for instance, mobile phones). However, the principles and advantages of the embodiments can be used for any other systems or apparatus that benefit from any of the circuits and systems described herein.

For example, power amplifier systems can be included in various electronic devices, including, but not limited to, consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a cascode power amplifier powered by a first supply voltage and configured to amplify a radio frequency input signal; and
a bias circuit including a voltage regulator configured to generate a regulated voltage and powered by the first supply voltage, a bias voltage generation circuit configured to receive the regulated voltage and to generate at least one cascode bias voltage for the cascode power amplifier, a switch configured to gate a second supply voltage to generate a gated supply voltage, a bias current generation circuit configured to control a bias current of the cascode power amplifier and powered by the gated supply voltage, and a gating circuit configured to control the switch based on the regulated voltage and the second supply voltage.

2. The power amplifier system of claim 1 wherein the cascode power amplifier includes a gain transistor and a first cascode transistor, the at least one cascode bias voltage including a first cascode bias voltage configured to bias the first cascode transistor.

3. The power amplifier system of claim 2 wherein the first cascode transistor is a field-effect transistor having a gate biased by the first cascode bias voltage and a source biased by the bias current.

4. The power amplifier system of claim 2 wherein the cascode power amplifier further includes a second cascode transistor, the at least one cascode bias voltage including a second cascode bias voltage configured to bias the second cascode transistor.

5. The power amplifier system of claim 1 wherein the bias circuit is configured to bias the cascode power amplifier across two or more voltage levels of the first supply voltage, the two or more voltage levels associated with two or more power supply domains.

6. The power amplifier system of claim 1 wherein the bias circuit includes a cascode control circuit for setting a voltage level of the at least one cascode bias voltage generated by the bias voltage generation circuit, and an interface circuit powered by a third supply voltage and configured to generate a bias current control signal for the bias current generation circuit and a bias voltage control signal for the cascode control circuit.

7. The power amplifier system of claim 6 wherein the gating circuit is further operable to control gating of the switch based on a voltage level of the third supply voltage.

8. The power amplifier system of claim 6 wherein the gating circuit is further configured to generate a power supply status signal for the cascode control circuit, the power supply status signal indicating when the gated supply voltage is active.

9. The power amplifier system of claim 6 wherein the cascode control circuit includes a level shifter configured to level shift the bias voltage control signal to a power domain of the first supply voltage.

10. A method of power amplifier biasing, the method comprising:
amplifying a radio frequency input signal using a cascode power amplifier that receives power from a first supply voltage;
generating a regulated voltage using a voltage regulator that receives power from the first supply voltage;
generating at least one cascode bias voltage for the cascode power amplifier based on the regulated voltage using a bias voltage generation circuit;

gating a second supply voltage to generate a gated supply voltage using a switch, including controlling the switch based on the regulated voltage and the second supply voltage; and controlling a bias current of the cascode power amplifier using a bias current generation circuit that receives power from the gated supply voltage.

11. The method of claim 10 further comprising setting a voltage level of the at least one cascode bias voltage using a cascode control circuit, and generating a bias current control signal for the bias current generation circuit and a bias voltage control signal for the cascode control circuit using an interface circuit that receives power from a third supply voltage.

12. The method of claim 11 further comprising controlling gating of the switch based on a voltage level of the third supply voltage.

13. The method of claim 11 further comprising generating a power supply status signal for the cascode control circuit, the power supply status signal indicating when the gated supply voltage is active.

14. A mobile device comprising:
a transceiver configured to generate a radio frequency input signal; and
a front end system including a cascode power amplifier powered by a first supply voltage and configured to amplify the radio frequency input signal, and a bias circuit including a voltage regulator configured to generate a regulated voltage and powered by the first supply voltage, a bias voltage generation circuit configured to receive the regulated voltage and to generate at least one cascode bias voltage for the cascode power amplifier, a switch configured to gate a second supply voltage to generate a gated supply voltage, a bias current generation circuit configured to control a bias current of the cascode power amplifier and powered by the gated supply voltage, and a gating circuit configured to control the switch based on the regulated voltage and the second supply voltage.

15. The mobile device of claim 14 wherein the bias circuit is configured to bias the cascode power amplifier across two or more voltage levels of the first supply voltage, the two or more voltage levels associated with two or more power supply domains.

16. The mobile device of claim 14 wherein the bias circuit includes a cascode control circuit for setting a voltage level of the at least one cascode bias voltage generated by the bias voltage generation circuit, and an interface circuit powered by a third supply voltage and configured to generate a bias current control signal for the bias current generation circuit and a bias voltage control signal for the cascode control circuit.

17. The mobile device of claim 16 wherein the gating circuit is further operable to control gating of the switch based on a voltage level of the third supply voltage.

18. The mobile device of claim 16 wherein the gating circuit is further configured to generate a power supply status signal for the cascode control circuit, the power supply status signal indicating when the gated supply voltage is active.

19. The mobile device of claim 16 wherein the cascode control circuit includes a level shifter configured to level shift the bias voltage control signal to a power domain of the first supply voltage.

20. The mobile device of claim 14 further comprising an antenna configured to wirelessly transmit an amplified radio frequency signal generated by the cascode power amplifier.

* * * * *